US010673184B2

(12) United States Patent
Pusheck

(10) Patent No.: US 10,673,184 B2
(45) Date of Patent: Jun. 2, 2020

(54) RIGID ELECTRICAL CONNECTION TO STRAIN SENSITIVE SENSING COMPONENT

(71) Applicant: VEONEER US INC., Southfield, MI (US)

(72) Inventor: Jacob Pusheck, West Bloomfield, MI (US)

(73) Assignee: VEONEER US INC., Southfield, MI (US)

(*) Notice: Subject to any disclaimer, the term of this patent is extended or adjusted under 35 U.S.C. 154(b) by 0 days.

(21) Appl. No.: 15/937,154

(22) Filed: Mar. 27, 2018

(65) Prior Publication Data

US 2019/0305491 A1    Oct. 3, 2019

(51) Int. Cl.
| H01R 13/66 | (2006.01) |
| G01D 11/24 | (2006.01) |
| H01R 12/57 | (2011.01) |
| H01R 13/41 | (2006.01) |
| H01R 43/02 | (2006.01) |
| H01R 43/20 | (2006.01) |
| H05K 5/00  | (2006.01) |

(52) U.S. Cl.
CPC ....... H01R 13/6683 (2013.01); G01D 11/245 (2013.01); H01R 12/57 (2013.01); H01R 13/41 (2013.01); H01R 43/0256 (2013.01); H01R 43/205 (2013.01); H05K 5/0078 (2013.01)

(58) Field of Classification Search
CPC ............ H01R 13/6658; H01R 13/6616; H01R 13/6683; H01R 13/5216; G01P 1/023
USPC ............. 439/76.1, 620.21, 620.22, 913, 936; 73/493
See application file for complete search history.

(56) References Cited

U.S. PATENT DOCUMENTS

| 5,577,937 | A | * | 11/1996 | Itoh ..................... H01R 13/6625 439/620.22 |
| 5,795,170 | A | * | 8/1998  | Okabe ................ H01R 13/5216 439/252 |
| 5,954,533 | A | * | 9/1999  | Hatagishi ............... H01R 43/24 439/397 |
| 6,053,049 | A |   | 4/2000  | Chen et al. ..................... 73/756 |

(Continued)

FOREIGN PATENT DOCUMENTS

| DE | 102012202982 | 8/2013  | ............. F16B 19/00 |
| DE | 102014206363 | 10/2015 | ............. G01B 21/02 |
| EP | 2036414      | 3/2009  | ............... H05K 7/14 |

Primary Examiner — Thanh Tam T Le
(74) Attorney, Agent, or Firm — Christopher P. Maiorana, PC

(57) ABSTRACT

An apparatus includes a sensor package, a housing, and one or more stitched terminals. The housing comprises a first cavity configured to receive the sensor package, a second cavity configured to receive an electrical connector, and a wall separating the cavities. The first cavity has a support surface located between a sensor receiving opening and the wall. The one or more stitched terminals are generally stitched into the wall, each having a sensor contact end extending into the first cavity and a connector contact end extending into the second cavity. At least one of the sensor package and the stitched terminals is positionable to align electrical contact pads of the sensor package with the sensor contact ends of the stitched terminals. The sensor package, when positioned between the support surface and the sensor contact ends of the stitched terminals, is essentially uncompressed.

20 Claims, 17 Drawing Sheets

(56) References Cited

U.S. PATENT DOCUMENTS

| | | | |
|---|---|---|---|
| 7,040,926 B2* | 5/2006 | Ferentz | H01R 13/6658 439/620.21 |
| 7,074,092 B1* | 7/2006 | Green | H01R 13/719 439/676 |
| 7,182,649 B2* | 2/2007 | Caveney | H05K 1/0228 439/620.22 |
| 7,281,957 B2* | 10/2007 | Caveney | H01R 13/6658 439/676 |
| 7,357,683 B2* | 4/2008 | Caveney | H01R 13/6658 439/676 |
| 7,500,394 B2* | 3/2009 | Steele | B60R 11/02 73/493 |
| 7,819,004 B2* | 10/2010 | Steele | B60R 21/01 73/493 |
| 7,823,281 B2* | 11/2010 | Caveney | H05K 1/028 29/857 |
| 8,435,082 B2* | 5/2013 | Bopp | H01R 13/6466 439/676 |
| 8,581,116 B2 | 11/2013 | Ludwig | 174/480 |
| 8,721,351 B2* | 5/2014 | Nitta | G01B 7/003 439/76.1 |
| 8,914,183 B2* | 12/2014 | Forwerck | H01R 13/112 439/249 |
| 8,966,975 B2 | 3/2015 | Campbell et al. | |
| 9,107,309 B2 | 8/2015 | Kurle | |
| 9,614,299 B2 | 4/2017 | Ludwig et al. | |
| 10,203,228 B2* | 2/2019 | Forwerck | B60R 16/0231 |
| 2008/0236307 A1 | 10/2008 | Watanabe et al. | 73/865.8 |
| 2012/0036930 A1 | 2/2012 | Kunert | 73/488 |
| 2012/0072047 A1 | 3/2012 | Forwerck et al. | 701/1 |
| 2012/0247205 A1 | 10/2012 | Hortig et al. | 73/431 |
| 2013/0044437 A1 | 2/2013 | Hortig et al. | 361/728 |
| 2017/0176486 A1 | 6/2017 | Steinbrink et al. | |
| 2018/0090868 A1* | 3/2018 | Forwerck | G01L 19/0069 |

* cited by examiner

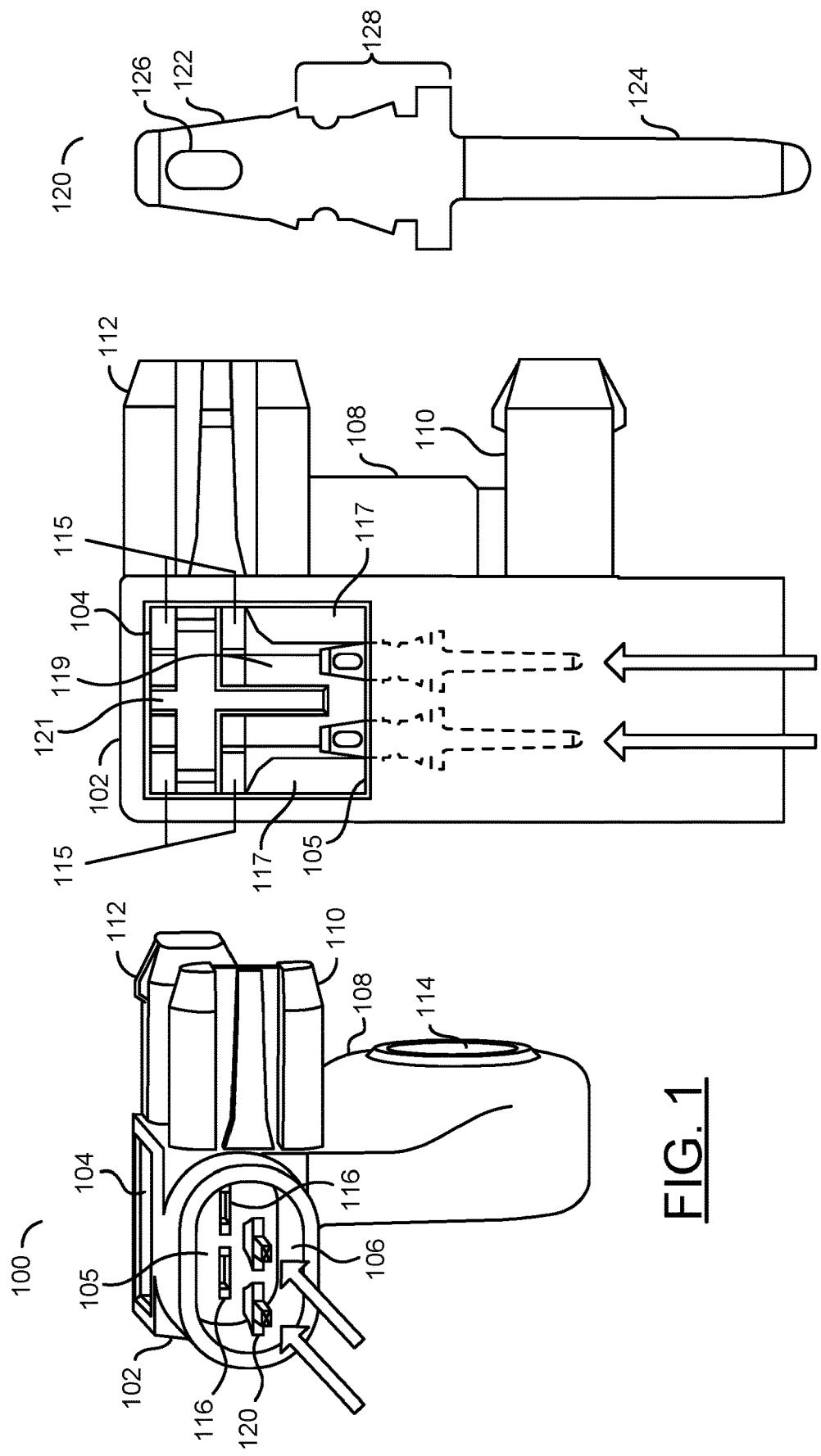

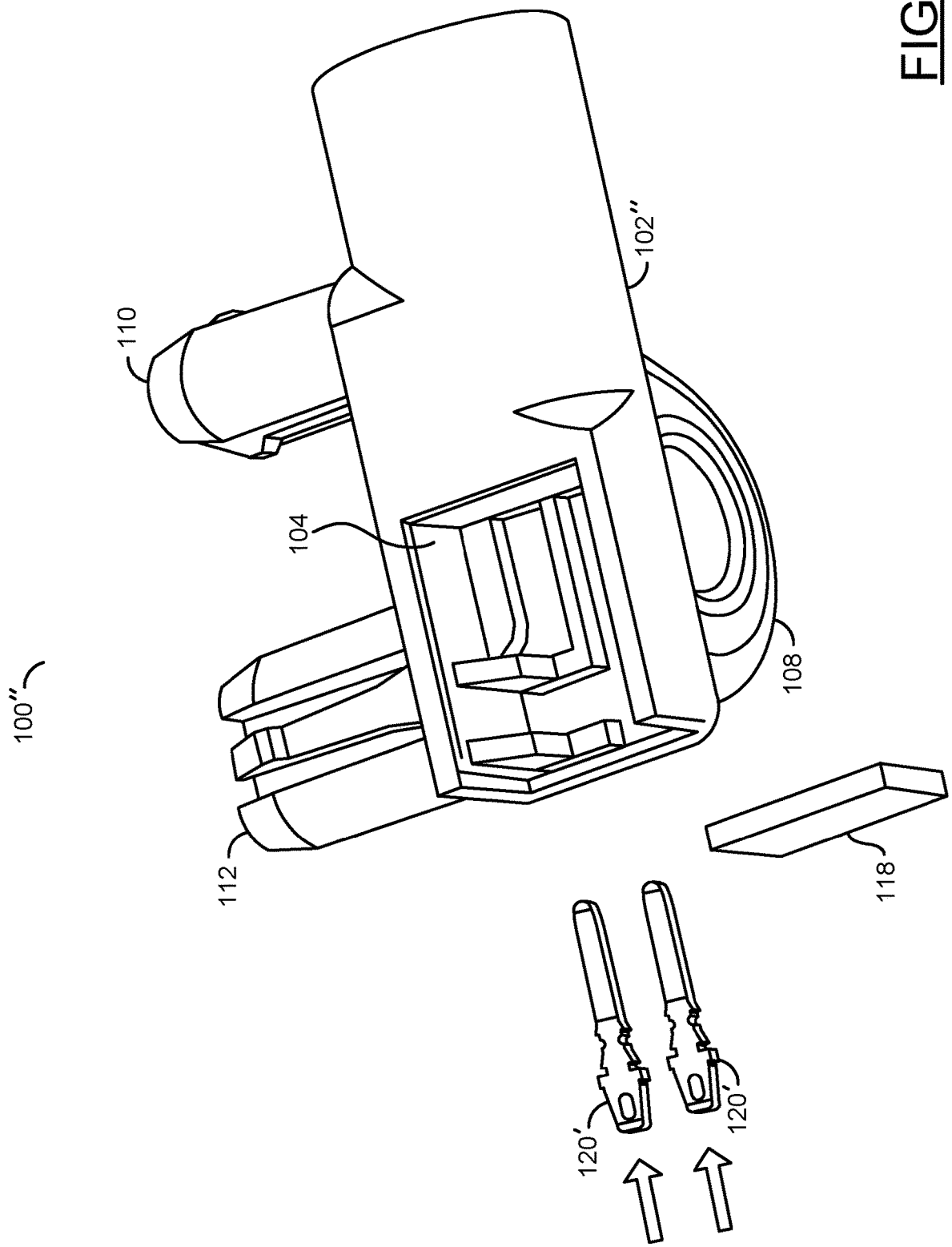

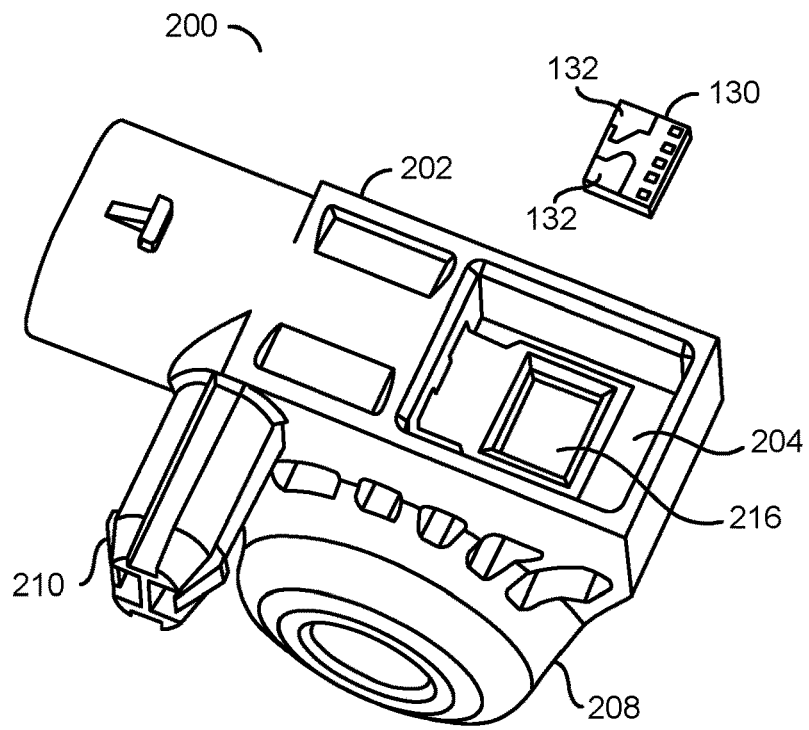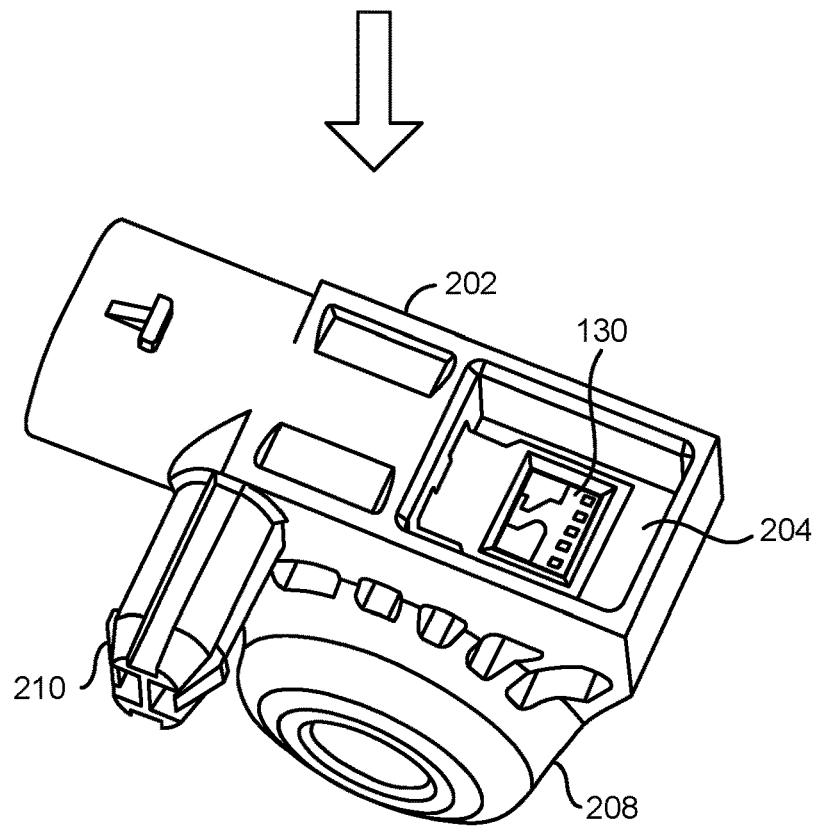
FIG. 15

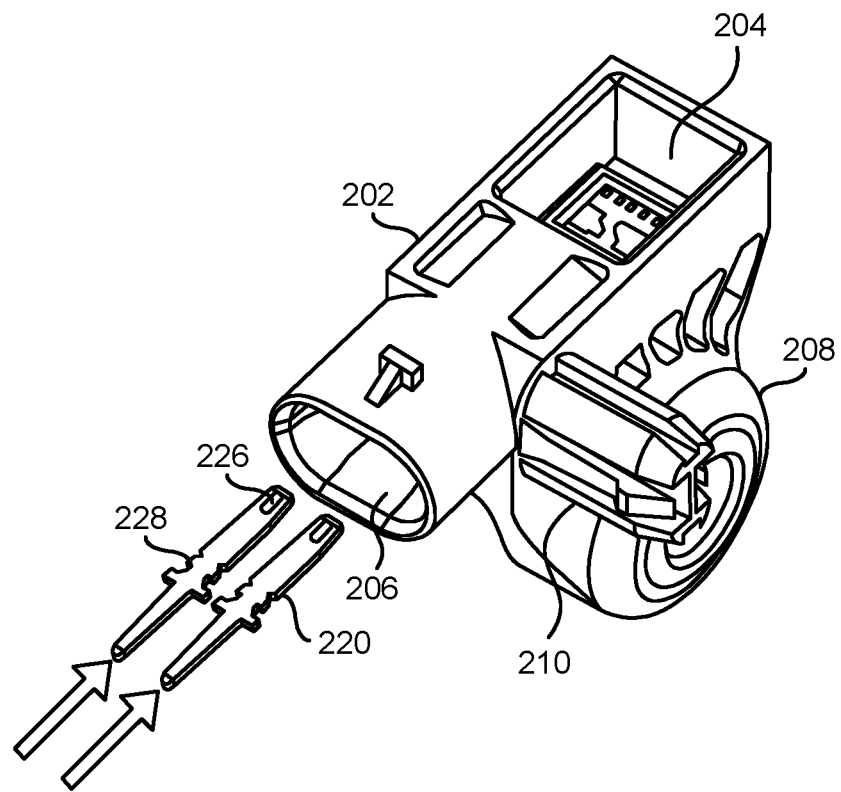
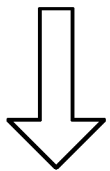
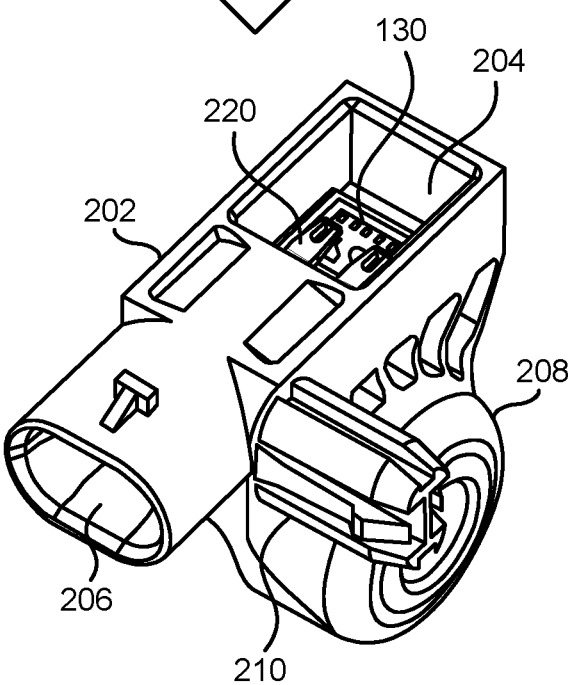
FIG. 16

RIGID ELECTRICAL CONNECTION TO STRAIN SENSITIVE SENSING COMPONENT

FIELD OF THE INVENTION

The invention relates to vehicle sensors generally and, more particularly, to a method and/or apparatus for implementing a rigid electrical connection to a strain sensitive sensing component.

BACKGROUND

There is currently a drive in the industry towards PCB-less sensors (e.g., sensors that do not require a printed circuit board (PCB)). PCB-less sensors have all the electrical components necessary to function properly. A difficulty with PCB-less technology is the electrical connection as well as constraint of the sensor position within the sensor housing. The difficulty is compounded with acceleration-based sensors. Because acceleration-based sensors are very sensitive to strain on the sensor package, the electrical connection(s) and constraint(s) should not strain the sensor package. Avoiding strain on the sensor package rules out compression fit operations with a spring type pin to maintain electrical connection. Thus, the method of connection is driven towards a soldered alternative. However, another drive in the industry is toward a stitched pin design (pins are pushed into place rather than over molded). To merge these two trends there are limited options. One option is to affix the sensor to a substrate to alleviate the strain related issues. Another option is to solder directly to the sensor but with a stitched pin the solder would inevitably be trapped below the sensor body leaving it unable to be soldered together as well as no access for a vision system to verify the connection.

It would be desirable to implement a rigid electrical connection to a strain sensitive sensing component.

SUMMARY

The invention concerns an apparatus comprising a sensor package, a housing, and one or more stitched terminals. The sensor package generally has a first surface comprising one or more electrical contact pads. The housing generally comprises a first cavity configured to receive the sensor package and a second cavity configured to receive an electrical connector. The first cavity and the second cavity are generally separated by a first wall. The first cavity has a support surface located between a sensor receiving opening and the first wall. The sensor receiving opening is generally dimensioned to receive the sensor package. The one or more stitched terminals are generally stitched into the first wall. Each of the one or more stitched terminals generally has a sensor contact end extending into the first cavity and a connector contact end extending into the second cavity. At least one of the sensor package and the stitched terminals is positionable to align the electrical contact pads with the sensor contact ends of the stitched terminals. The sensor package, when positioned between the support surface and the sensor contact ends of the stitched terminals, is essentially uncompressed.

BRIEF DESCRIPTION OF THE FIGURES

Embodiments of the invention will be apparent from the following detailed description and the appended claims and drawings in which:

FIG. 1 is a diagram illustrating a sensor housing in accordance with an example embodiment of the invention;

FIG. 2 is a diagram illustrating a sensor cavity of a sensor housing in accordance with an example embodiment of the invention;

FIG. 3 is a diagram illustrating a plan view of the stitched terminal of FIG. 1;

FIG. 7 is a diagram illustrating another example sensor housing in accordance with an example embodiment of the invention;

FIG. 15 is a diagram illustrating placement of a sensor package into a pocket within the sensor cavity of the sensor housing of FIG. 13 prior to terminal stitching;

FIG. 16 is a diagram illustrating an embodiment where stitched terminals are inserted via a connector cavity of the sensor housing of FIG. 13 after the sensor package has been placed in the pocket of the sensor housing of FIG. 13;

DETAILED DESCRIPTION OF THE EMBODIMENTS

Figure 6:
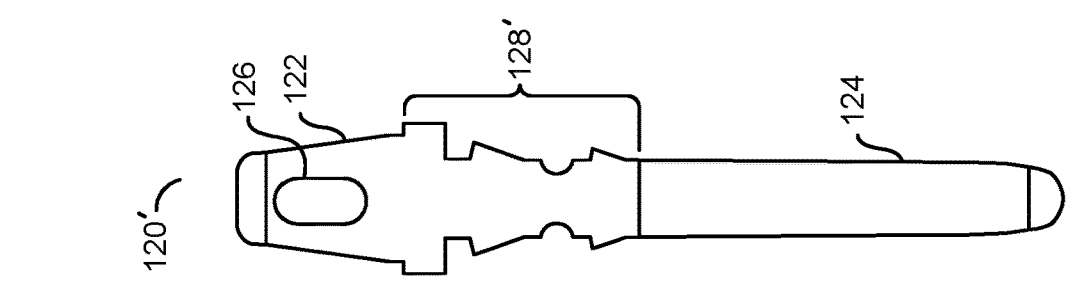
FIG. 6 is a diagram illustrating details of the stitched terminal of FIG. 4.

Embodiments of the present invention include providing a method and/or apparatus for implementing a rigid electrical connection to a strain sensitive sensing component that may (i) provide a groove by which a sensor component may be translated inside a sensor housing, (ii) provide an open region within a remote sensing unit (RSU) housing that allows the sensor to be placed below one or more connector pins, (iii) provide a cavity, defined on the sides and bottom by surfaces of the sensor housing and on top by stitched in pins, into which the sensor may be slid, (iv) allow the sensor to be seated without applying a compressive force on the sensor body, (v) provide a hole in the end of the stitched in pins into which solder may be deposited, (vi) provide ribs in the aforementioned groove that center the sensor body into the sensor cavity, (vii) keep the sensor straight and oriented correctly, (viii) allow for the sensor body to be guided into position within the sensor cavity of a sensor housing, (ix) provide an open region that allows the sensor body to be placed below the stitched in pins, (x) provide a cavity that constrains the sensor body over life and orients the sensor body relative to the connector pins, (xi) prevent transmission of compression to the sensor body, (xii) allow for solder to be deposited and inspected, (xiii) utilize guide ribs to center and constrain the sensor body over life, (xiv) allow for environmental resistance by use of potting or a secondary cover, (xv) allow for a fully PCB-less remote sensor unit (RSU) design, (xvi) allow solder preform, (xvii) allow for solder to be reflowed effectively (localized reflow of placed solder), (xviii) allow for final inspection of the solder joint(s) to verify robustness of connection, (xix) allow for stitched terminals, (xx) rigidly constrain the sensor body relative to the housing over life, (xxi) be sealed with potting or a secondary cover, and/or (xxii) be implemented as one or more steps of an automated assembly process.

In various embodiments, the invention provides solutions to the limitations of existing techniques, while avoiding compromises. In various embodiments, terminals (or pins) may be stitched into a sensor housing either through a connector cavity or through a sensor cavity. The sensor housing may be configured to allow for more advantageous directions of inserting a sensor package into the sensor cavity (or pocket). In some embodiments, the sensor package may be placed into the sensor cavity and slid into place beneath previously stitched terminals (or pins) without invoking stress upon the sensor package. In some embodiments, the sensor package may be placed in a pocket within the sensor cavity prior to stitching the terminals (or pins).

In various embodiments, formation of a rigid electrical connection to a strain sensitive sensing component is facilitated. In an example, once the sensor package and stitched pins are installed in the sensor housing, solder (e.g., preform solder balls) may be placed in contact with contact pads in a surface of the sensor package and the stitched pins (e.g., within specific holes in the pins configured to allow the placement of the solder). A reflow operation may be performed to rigidly connect the pins to the contact pads in the surface of the sensor package. In various embodiments, a sensor housing and an assembly method are provided that allow for stitching pins either before or after installing a sensor package, avoiding compression on the sensor package (or body), accessing solder connections for reflow and solder junction inspection, and providing rigid constraint of the sensor package over a lifetime of a remote senor unit (RSU).

Referring to FIG. 1, a diagram is shown illustrating a sensor module 100 in accordance with an example embodiment of the invention. The sensor module (or apparatus or device or unit) 100 generally implements a kinematic sensor suitable for use in automotive applications. In an example, the sensor module 100 may be used to implement a remote sensor unit (RSU). In an example, the RSU may be part of a passive restraint control system of a vehicle. The sensor module 100 generally comprises a housing assembly 102. In an example, the housing assembly 102 may comprise a first cavity 104, a second cavity 106, a mounting boss 108, a first locating (or anti-rotation) tab 110 and a second locating (or anti-rotation) tab 112.

The housing assembly 102 may be formed of a plastic material. In various embodiments, the plastic material may include, but is not limited to polyamide (NYLON), polybutylene terephthalate (PBT), polypropylene, polyethylene terephthalate (PET), acrylonitrile butadiene styrene (ABS), and/or various alloys and/or fillers of these resins. The housing assembly 102 may be formed using various techniques including, but not limited to casting, injection-molding, and three-dimensional printing. The housing assembly 102 may have a generally elongated shape. The first cavity 104 may be configured to receive a sensor package. The second cavity 106 may be configured to receive an electrical connector (e.g., for connecting the sensor module to the vehicle systems). The mounting boss 108 generally includes a mounting bore 114. The mounting bore 114 is generally configured to receive a bolt for mounting the sensor module to a structure (e.g., frame, pillar, or panel of a vehicle, etc.). In some embodiments, a bushing may be disposed within the mounting bore 114 to isolate the sensor module from the mounting structure. The bushing may be a metal bushing.

The first cavity 104 is generally disposed at a first (e.g., back) end of the housing assembly 102. The first cavity 104 may be accessible through an opening (e.g., a sensor receiving opening) in a first (e.g., top) surface of the housing assembly 102. The first (sensor) cavity 104 and sensor receiving opening providing access to the inside of the first cavity 104 are generally shaped to receive and allow manipulation of a sensor package. The second cavity 106 may be formed at a second (front) end of the housing assembly 102, opposite from the first end. The second cavity 106 is generally accessible through an opening in the second end of the housing assembly 102. The first cavity 104 and the second cavity 106 may be separated by a wall 105.

A number of ports 116 may be formed in the wall 105 separating the cavities 104 and 106. The ports 116 are generally configured to facilitate insertion of stitched-in terminals 120 (e.g., an insertion direction is indicated by arrows). The second cavity 106 is generally shaped to receive an electrical socket (or plug) configured to make electrical connection(s) between the terminals (or pins) 120 and a wiring harness of a vehicle. When inserted, the pins 120 generally have a first (sensor contact) end 122 that extends through the wall 105 into the first cavity 104 and a second (connector) end 124 extending from the wall into the second cavity 106. The first ends 122 may be configured to facilitate connection (e.g., via solder deposition and reflow) to the sensor package in the first cavity 104.

The locating (or anti-rotation) tab 110 and the locating (or anti-rotation) tab 112 may be disposed along a side of the sensor housing 102. The mounting boss 108, the locating (or anti-rotation) tab 110, and the locating tab 112 are generally configured to facilitate locating the sensor module 100 to a vehicle structure (e.g., A-pillar, B-pillar, door panel, body panel, etc.). The locating tab 110 and the locating tab 112 may include resilient tabs (barbs) providing a snap fit into a corresponding receiving hole of the vehicle structure to which the sensor module 100 is mounted. In various embodiments, a center axis of the mounting bore 114 may be aligned parallel to the locating tabs 110 and 112. In an example, the mounting boss 108 may be askew of (or offset from) a centerline of the portion of the housing assembly 102 containing the first cavity 104 and the second cavity 106. Other arrangements of the mounting boss 108 and the location features 110 and 112 may be implemented to meet the design criteria of a particular application.

Referring to FIG. 2, a diagram is shown illustrating the sensor cavity 104 of the sensor housing 102 in accordance with an example embodiment of the invention. In various embodiments, the first (sensor) cavity 104 may include features (e.g., a number of stops, ribs and/or ledges). The stops (not shown), ribs 115, and/or ledges 117 are generally configured to guide the sensor package within the sensor cavity 104 and allow the sensor package to be translated (slid) along a support surface 119 into position adjacent the terminals 120 (e.g., between the support surface 119 and the terminals 120). The stops, ribs 115, and/or ledges 117 may be further configured to constrain the sensor package once the sensor package is translated (slid) into position adjacent the terminals 120 (e.g., between the support surface 119, the ledges 117, the wall 105, and the terminals 120).

In some embodiments, a groove or grooves 121 may be formed in the support surface 119 within the first (sensor) cavity 104. The groove(s) 121 allow(s) an assembly tool to place the sensor package onto the support surface 119 within the sensor cavity 104 and slide the sensor package toward the wall 105 separating the first (sensor) cavity 104 from the second (connector) cavity 106. The features in the first (sensor) cavity 104 may be configured to ensure that the sensor package sits flat against the support surface 119 of the first (sensor) cavity 104.

Referring to FIG. 3, a diagram is shown illustrating an example implementation of a stitched terminal 120 in accordance with an example embodiment of the invention. The ports 116 of the sensor housing 102 are generally configured to facilitate insertion of the stitched terminals (or pins) 120. The terminals (pins) 120 generally have a first (sensor contact) end 122, a second (connector) end 124, a hole (or opening or aperture) 126, and a shouldered barbed section 128. When each terminal (or pin) 120 is stitched into a respective port 116 from the second cavity 106, the first (sensor contact) end 122 extends through the wall into the first cavity 104, the second (connector) end 124 extends from the wall into the second cavity 106, and the shouldered barbed section 128 embeds in the wall between the cavities 104 and 106. The hole 126 in the first end 122 may be configured to facilitate a rigid connection (e.g., via solder deposition and reflow) to the sensor package in the first cavity 104.

In various embodiments, the ports 116 may be formed slightly smaller than the terminals 120 such that a tight mechanical fit is formed to hold the terminals 120 in place in the wall of the housing assembly 102. The barbs of the shouldered barbed sections 128 lock the terminals 120 into the ports 116, preventing the terminals 120 from being pulled out easily. The shoulders of the shouldered barbed sections 128 generally limit the depth of insertion of the terminals 120 and absorb a force on the terminals 120 when a connector is plugged into the sensor housing 102.

Figure 4:
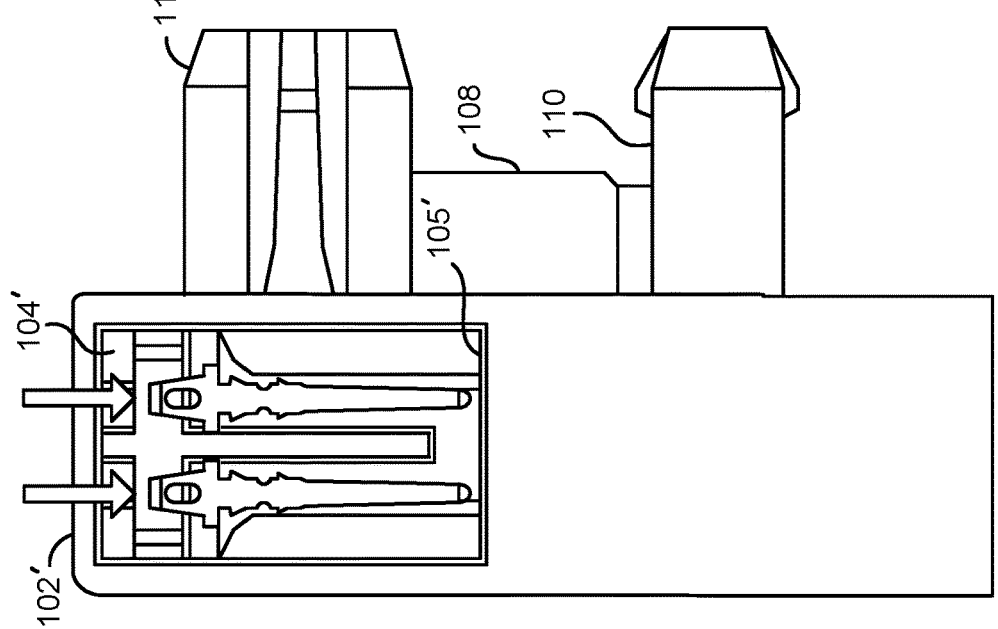
FIG. 4 is a diagram illustrating another example sensor housing in accordance with an example embodiment of the invention.

Referring to FIG. 4, a diagram is shown illustrating a sensor module 100' in accordance with another example embodiment of the invention. The sensor module (or apparatus or device or unit) 100' generally implements a kinematic sensor suitable for use in automotive applications. In an example, the sensor module 100' may be used to implement a remote sensor unit (RSU). In an example, the RSU may be part of a passive restraint control system of a vehicle. The sensor module 100' generally comprises a housing assembly 102'. In an example, the housing assembly 102' may comprise a first cavity 104', a second cavity 106, a mounting boss 108, a first locating (or anti-rotation) tab 110, and a second locating (or anti-rotation) tab 112. The sensor module 100' is generally similar to the sensor module 100 except that the first cavity 104' of the housing assembly 102' is elongated compared to the first cavity 104 of the sensor module 100. The elongated first cavity 104' allows stitched terminals to be stitched from within the first cavity 104'.

The housing assembly 102' may be formed of a plastic material. In various embodiments, the plastic material may include, but is not limited to polyamide (NYLON), polybutylene terephthalate (PBT), polypropylene, polyethylene terephthalate (PET), acrylonitrile butadiene styrene (ABS), and/or various alloys and/or fillers of these resins. The housing assembly 102' may be formed using various techniques including, but not limited to casting, injection-molding, and three-dimensional printing. The housing assembly 102' may have a generally elongated shape. The first cavity 104' may be configured to receive a sensor package and stitched terminals. The second cavity 106 may be configured to receive an electrical connector (e.g., for connecting the sensor module to the vehicle systems). The mounting boss 108 generally includes a mounting bore 114. The mounting bore 114 is generally configured to receive a bolt for mounting the sensor module to a structure (e.g., frame, pillar, or panel of a vehicle, etc.). In some embodiments, a bushing may be disposed within the mounting bore 114 to isolate the sensor module from the mounting structure. The bushing may be a metal bushing.

The first cavity 104' is generally disposed at a first (e.g., back) end of the housing assembly 102'. The first cavity 104' may be accessible through an opening (e.g., a sensor receiving opening) in a first (e.g., top) surface of the housing assembly 102'. The first (sensor) cavity 104' and sensor receiving opening providing access to the inside of the first cavity 104' are generally shaped to receive and allow manipulation of stitched terminal pins and a sensor package. The second cavity 106 may be formed at a second (front) end of the housing assembly 102', opposite from the first end. The second cavity 106 is generally accessible through an opening in the second end of the housing assembly 102'. The first cavity 104' and the second cavity 106 may be separated by a wall 105'.

A number of ports 116 may be formed in the wall separating the cavities 104' and 106. The ports 116 are generally configured to facilitate insertion of stitched-in terminals 120 (e.g., an insertion direction is indicated by arrows). The second cavity 106 is generally shaped to receive an electrical socket (or plug) configured to make electrical connection(s) between the terminals (or pins) 120' and a wiring harness of a vehicle. The pins 120' generally have a first (sensor contact) end 122 that extends from the wall into the first cavity 104' and a second (connector) end 124 extending from the wall into the second cavity 106. The first ends may be configured to facilitate connection (e.g., via solder deposition and reflow) to the sensor package in the first cavity 104'.

The locating (or anti-rotation) tab 110 and the locating (or anti-rotation) tab 112 may be disposed along a side of the sensor housing 102'. The mounting boss 108, the locating (or anti-rotation) tab 110, and the locating tab 112 are generally configured to facilitate locating the sensor module 100' to a vehicle structure (e.g., A-pillar, B-pillar, door panel, body panel, etc.). The locating tab 110 and the locating tab 112 may include resilient tabs (barbs) providing a snap fit into a corresponding receiving hole of the vehicle structure to which the sensor module 100' is mounted. In various embodiments, a center axis of the mounting bore through the mounting boss 108 may be aligned parallel to the locating tabs 110 and 112. In an example, the mounting boss 108 may be askew of (or offset from) a centerline of the portion of the housing assembly 102' containing the first cavity 104' and the second cavity 106. Other arrangements of the mounting boss 108 and the location features 110 and 112 may be implemented to meet the design criteria of a particular application.

Figure 5:
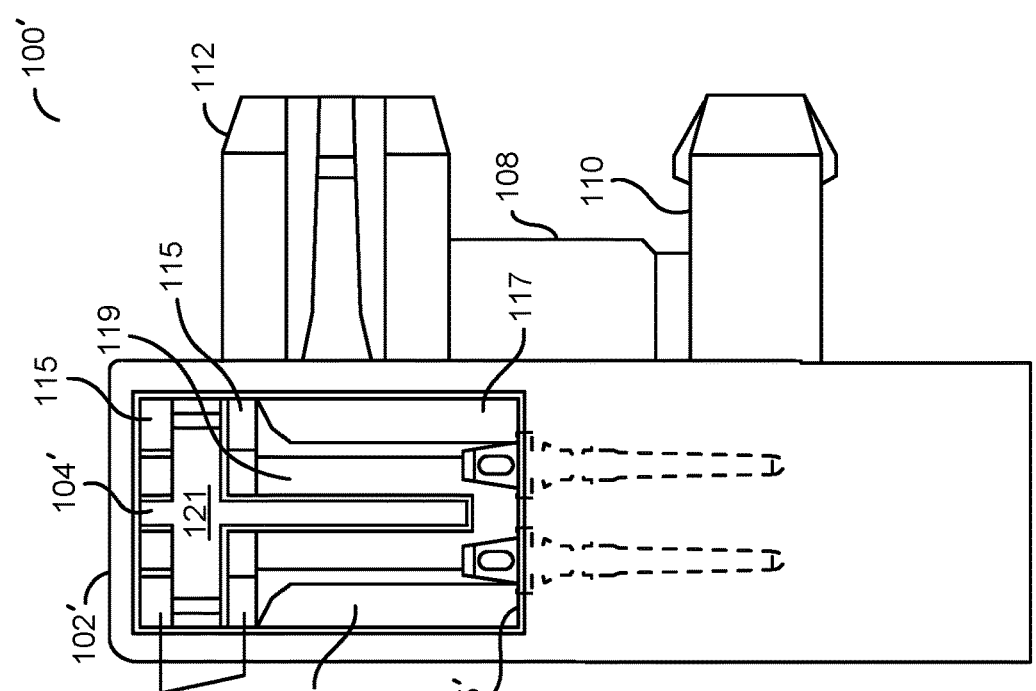
FIG. 5 is a diagram illustrating terminals stitched in a sensor cavity of the sensor housing of FIG. 4.

Referring to FIG. 5, a diagram is shown illustrating the sensor cavity 104' of the sensor housing 102' in accordance with an example embodiment of the invention. In various embodiments, the first (sensor) cavity 104' may include features (e.g., a number of stops_, ribs and/or ledges). The stops (not shown), ribs 115, and/or ledges 117 are generally configured to guide the sensor package within the sensor cavity 104' and allow the sensor package to be translated (slid) along a support surface 119 into position adjacent the terminals 120' (e.g., between the support surface 119 and the terminals 120'). The stops, ribs 115, and/or ledges 117 may be further configured to constrain the sensor package once the sensor package is translated (slid) into position adjacent the terminals 120' (e.g., between the support surface 119, the ledges 117, the wall 105', and the terminals 120').

In some embodiments, a groove or grooves 121 may be formed in the support surface 119 within the first (sensor) cavity 104'. The groove(s) 121 allow(s) an assembly tool to place the sensor package onto the support surface within the sensor cavity 104' and slide the sensor package along the support surface 119 toward the wall 105' separating the first (sensor) cavity 104' from the second (connector) cavity 106. The features in the first (sensor) cavity 104' may be configured to ensure that the sensor package sits flat against the support surface 119 of the first (sensor) cavity 104'.

Referring to FIG. 6, a diagram is shown illustrating an example implementation of a stitched terminal 120' in accordance with an example embodiment of the invention. Similar to the sensor housing 102, the sensor housing 102' may include ports 116 that are generally configured to facilitate insertion of the stitched terminals (or pins) 120'. The pins 120' generally have a first (sensor contact) end 122, a second (connector) end 124, a hole (or opening or aperture) 126, and a shouldered barbed section 128'. When each of the terminals (or pins) 120' is stitched into a respective port 116 from the first (sensor) cavity 104', the first (sensor contact) end 122 extends from the wall into the first cavity 104', the second (connector) end 124 extends from the wall into the second cavity 106, and the shouldered barbed section 128' embeds in the wall. The hole 126 in the first end 122 may be configured to facilitate a rigid connection (e.g., via solder deposition and reflow) to the sensor package in the first cavity 104'.

In various embodiments, the ports 116 may be formed slightly smaller than the terminals 120' such that a tight mechanical fit is formed to hold the terminals 120' in place in the wall of the housing assembly 102'. The barbs of the shouldered barbed sections 128' lock the terminals 120' into the ports 116, preventing the terminals 120' from being pulled out easily. The shoulders of the shouldered barbed sections 128' generally limit the depth of insertion of the terminals 120'.

Referring to FIG. 7, a diagram is shown illustrating a sensor module 100" in accordance with another example embodiment of the invention. The sensor module 100" generally comprises a housing assembly 102". The sensor module 100" may be implemented similarly to the sensor module 100, except that the first (sensor) cavity 104 of the housing assembly 102" has a removable end portion (or wall or cap) 118. The removable end portion 118 and the sensor housing 102" generally include features (e.g., groove, mortise, tenon, rabbet, etc.) that allow the end portion 118 to interlock with the housing assembly 102" to solidly close the end of the first (sensor) cavity 104. With the end portion 118 removed, the open end of first (sensor) cavity 104 allows stitched terminals 120' to be stitched from within the first cavity 104 without the first cavity 104 needing to be elongated.

Figure 8:
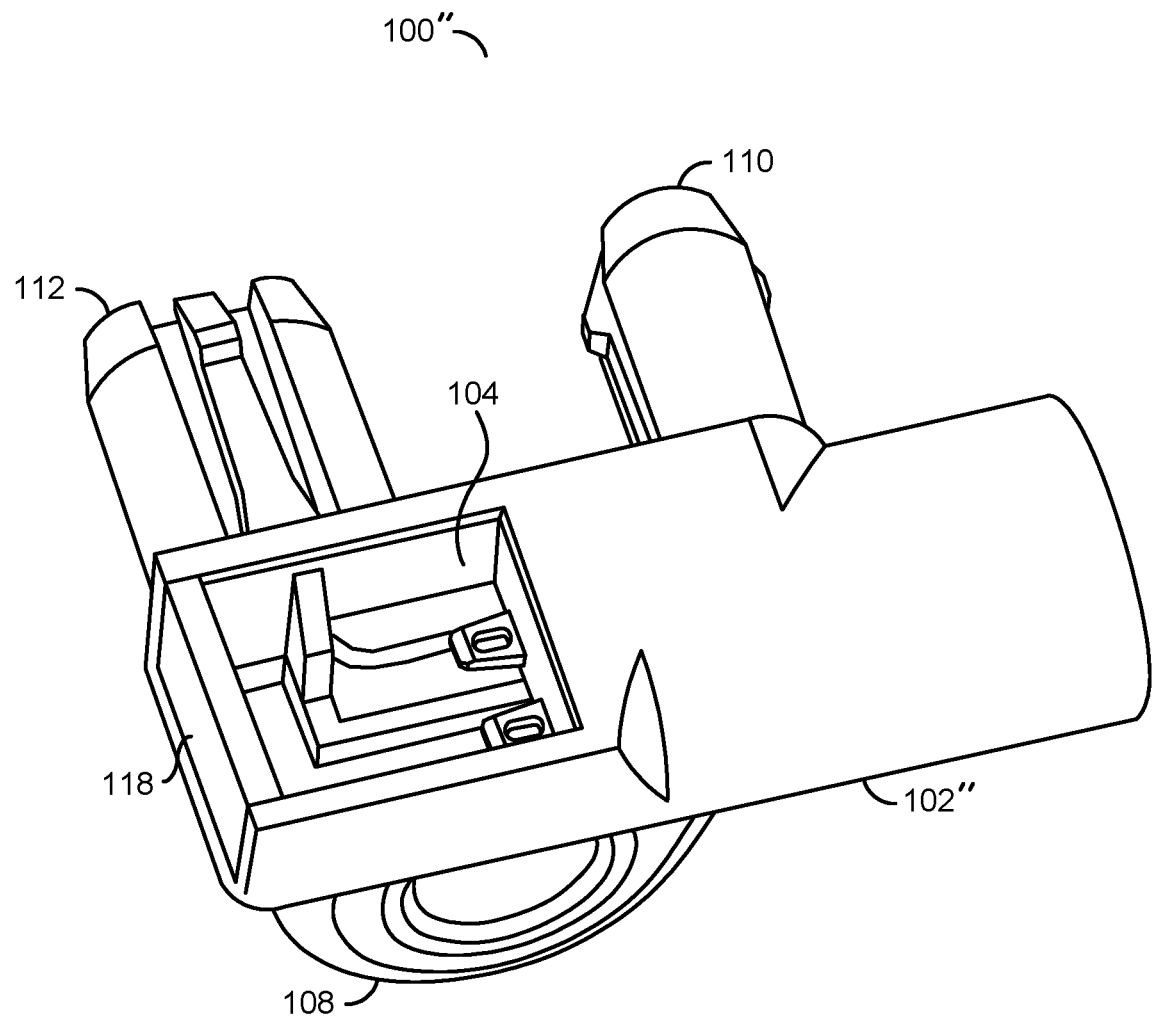
FIG. 8 is a diagram illustrating an end cap of the sensor housing of FIG. 7 installed.

Referring to FIG. 8, a diagram is shown illustrating the sensor module 100" with the end portion 118 installed. In various embodiments, the end of the sensor cavity 104 may be sealed with the end portion 118 bonded (e.g., through gluing, fusing, or using plastic welding techniques) to the sensor housing 102". Once the end portion 118 has been bonded to the sensor housing 102", the sensor module 100" may be utilized similarly to the sensor module 100.

Figure 9:
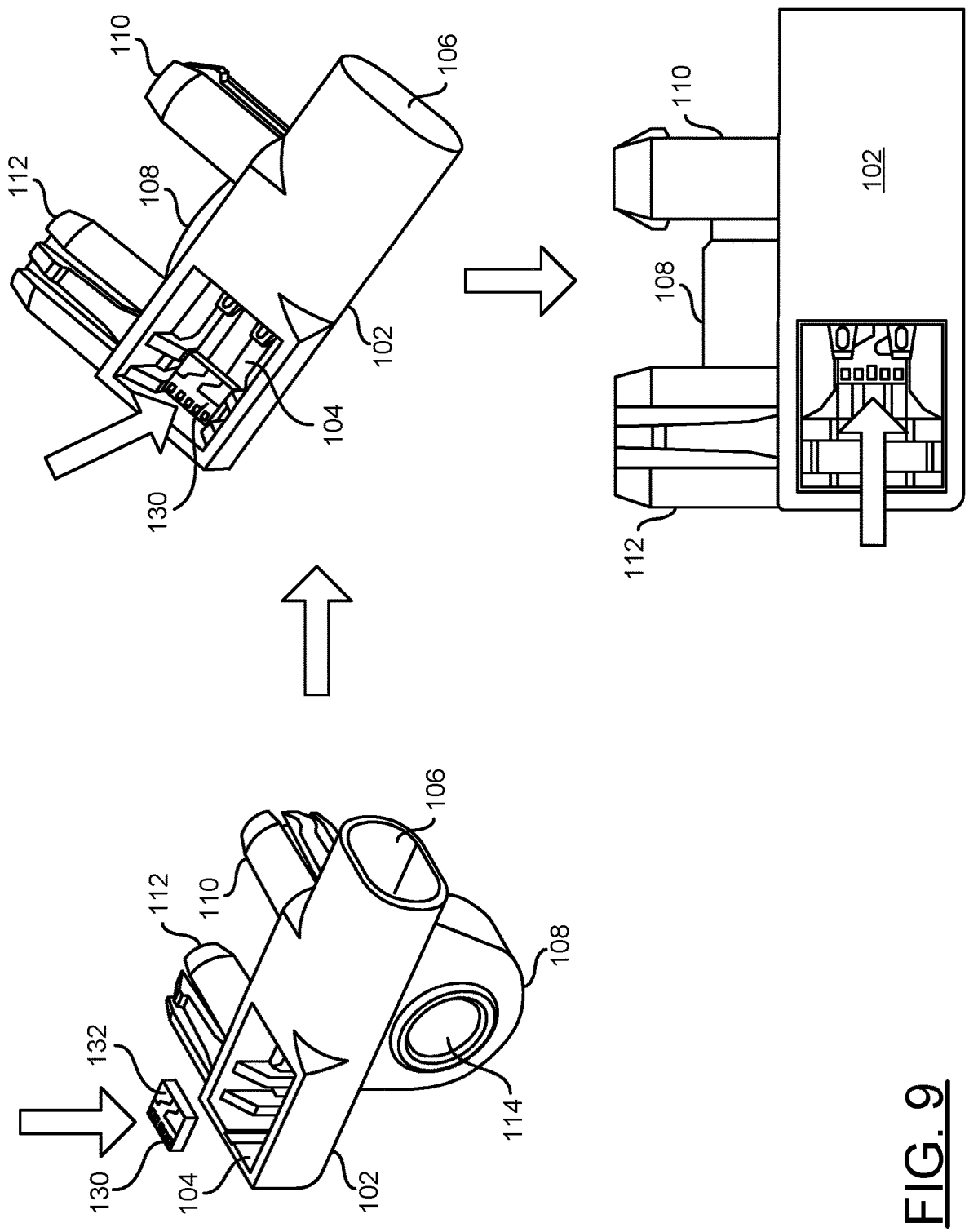
FIG. 9 is a diagram illustrating an insert and slide process in accordance with an example embodiment of the invention.

Referring to FIG. 9, a diagram is shown illustrating a place and slide process in accordance with an example embodiment of the invention. Although the place and slide process is illustrated using the housing 102 of FIG. 1, a similar process may be performed using the housings 102' and 102". In an example, a sensor package 130 may be placed into the sensor cavity 104 onto a recessed support surface through a sensor receiving opening in the sensor cavity 104. The sensor package 130 may be placed with a surface containing electrical contact pads 132 facing towards the sensor receiving opening in the sensor cavity 104. The sensor package 130 may then be slid into position towards the wall separating the sensor cavity 104 from the connector cavity 106. When slid into position, the sensor package 130 is placed in a position between the recessed (bottom) support surface of the sensor cavity 104, a ridge (or ledge) on either side, and a number of pins 120 stitched through the wall separating the sensor cavity 104 from the connector cavity 106. When the sensor is in position, the electrical contact pads 132 are adjacent to the apertures 126 in the terminal pins 120.

Figure 10:
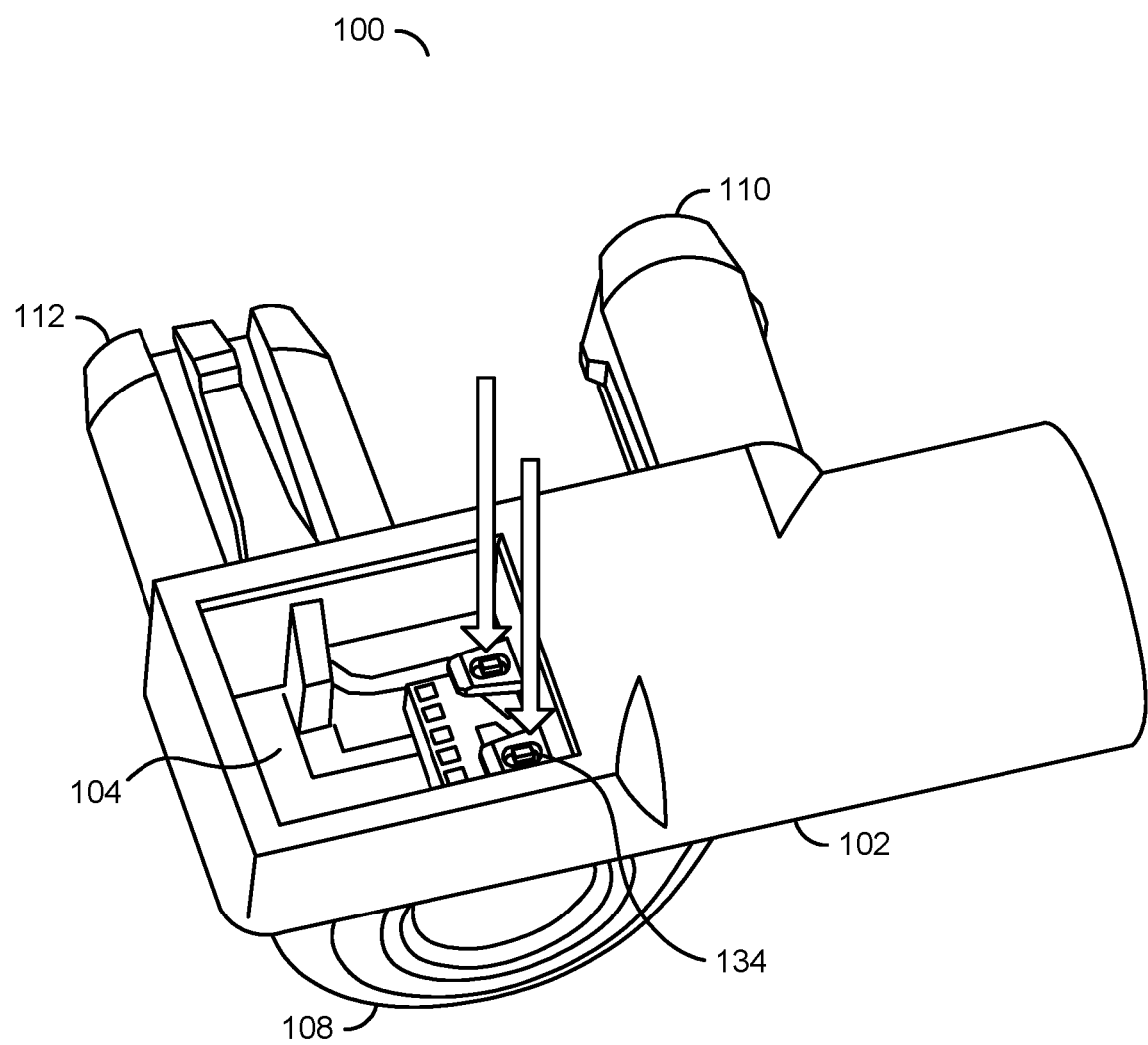
FIG. 10 is a diagram illustrating formation of electrical and mechanical connections between a sensor package and stitch in terminals in a sensor housing in accordance with an example embodiment of the invention.

Referring to FIG. 10, a diagram is shown illustrating formation of electrical and mechanical connections between a sensor package and stitch in terminals in a sensor housing in accordance with an example embodiment of the invention. In an example, once the sensor package 130 is slid into position, preform solder balls 134 may be placed into the openings (or apertures) 126 in the pins 120 and a reflow operation performed to electrically and mechanically connect the pins 120 to the contact pads 132 on the surface of the sensor package 130. The reflowed solder and the stitched terminals 120 form a rigid connection between the sensor package 130 and the sensor housing 102.

Figure 11:
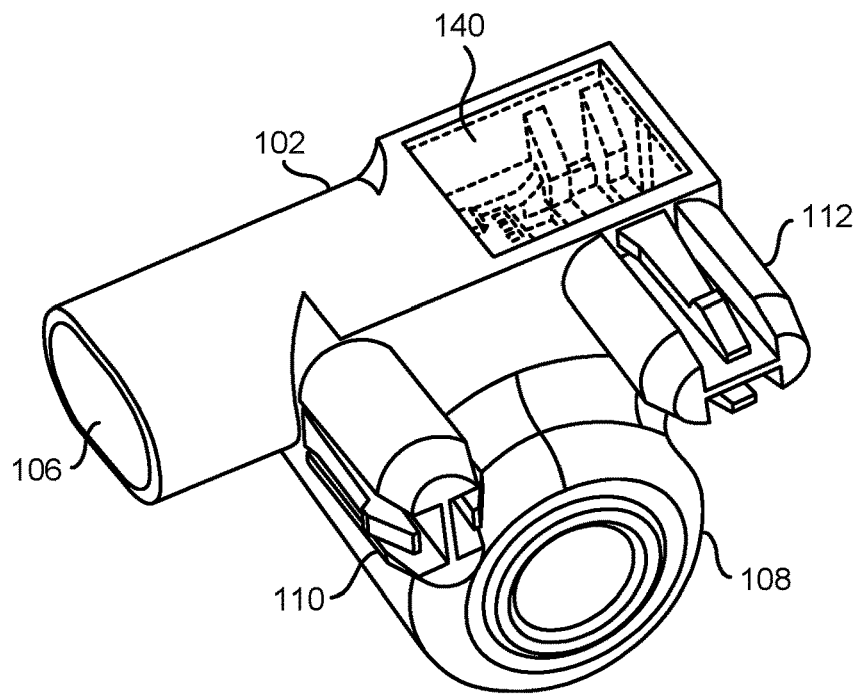
FIGS. 11 and 12 are diagrams illustrating example methods of providing an environmental seal in a sensor housing in accordance with an example embodiment of the invention.
Figure 12:
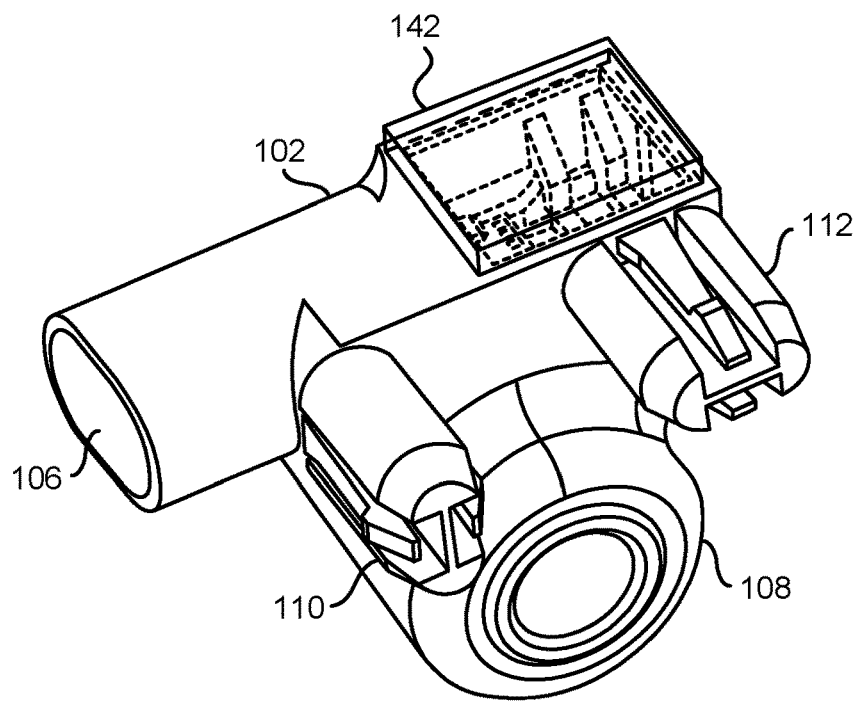

Referring to FIGS. 11 and 12, diagrams are shown illustrating example methods of providing an environmental seal in a sensor housing in accordance with an example embodiment of the invention. When the terminal pins 120 have been electrically and mechanically connected to the sensor package 130, the solder joints may be inspected through the opening in the sensor cavity 104 to verify robustness of the connection. When the inspection is completed, the sensor cavity 104 may be sealed from the external environment. In an example, the sensor cavity 104 may be sealed using a potting material 140 (FIG. 11). In another example, the sensor cavity 104 may be sealed with a cap 142 bonded (e.g., glued, fused, or using plastic welding techniques) to the sensor housing 102 (FIG. 12).

Figure 13:
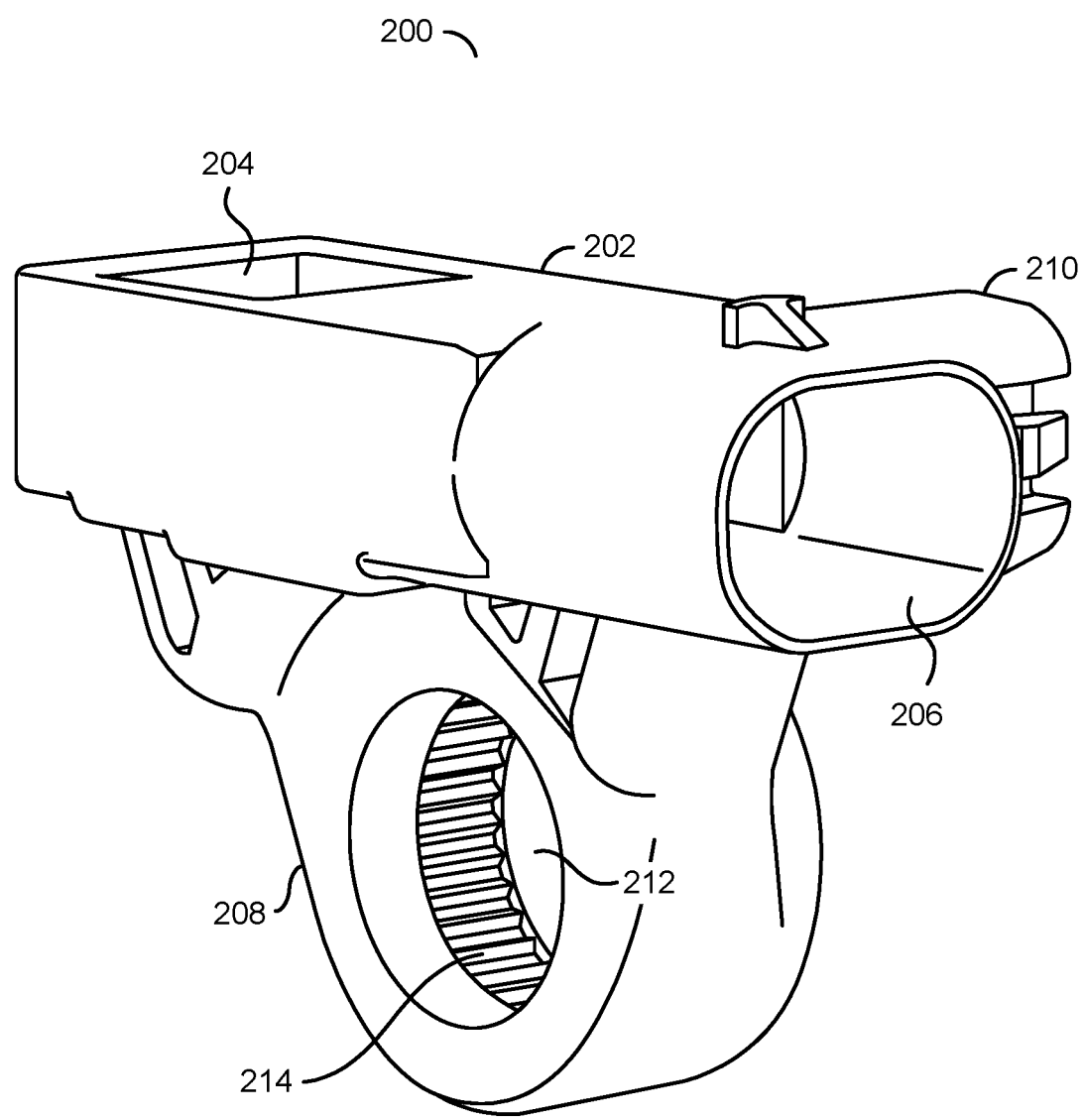
FIG. 13 is a diagram illustrating another sensor housing in accordance with another example embodiment of the invention.

Referring to FIG. 13, a diagram is shown illustrating a sensor module 200 in accordance with another example embodiment of the invention. The sensor module (or apparatus or device or unit) 200 generally implements a kinematic sensor suitable for use in automotive applications. In an example, the sensor module 200 may be used to implement a remote sensor unit (RSU) that is part of a restraint control system of a vehicle. The sensor module 200 generally comprises a housing assembly 202. The housing assembly 202 may comprise a first cavity 204, a second cavity 206, a mounting boss 208, and a locating (or anti-rotation) tab 210.

The housing assembly 202 may be formed of a plastic material. In various embodiments, the plastic material may include, but is not limited to polyamide (NYLON), polybutylene terephthalate (PBT), polypropylene, polyethylene terephthalate (PET), acrylonitrile butadiene styrene (ABS), and/or various alloys and/or fillers of these resins. The housing assembly 202 may be formed using various techniques including, but not limited to casting, injection-molding, and three-dimensional printing. The housing assembly 202 may have a generally elongated shape. The first cavity 204 may be configured to receive a sensor package. The second cavity 206 may be configured to receive an electrical connector (e.g., for connecting the sensor module to the vehicle systems). The mounting boss 208 generally includes a mounting bore 212. The mount bore 212 is generally configured to receive a bolt for mounting the sensor module to a structure (e.g., frame, pillar, or panel of a vehicle, etc.). A bushing 214 may be disposed within the mounting bore 212. The bushing 214 may be configured to isolate the sensor module from the mounting structure. The bushing 214 may be a metal bushing.

The first cavity 204 is generally disposed at a first (back) end of the housing assembly 202. The first cavity 204 may be accessible through an opening (e.g., a sensor receiving opening) in a first (e.g., top) surface of the housing assembly 202. The first cavity 204 and associated opening are generally shaped to receive and allow manipulation of a sensor package and/or stitch in a number of terminal pins. The second cavity 206 may be formed at a second (e.g., front) end of the housing assembly 202, opposite from the first end. The second cavity 206 is generally accessible through an opening in the second end of the housing assembly 202. The second cavity 106 is generally shaped to receive an electrical socket (or plug) configured to make electrical connection(s) between a wiring harness of a vehicle and the terminal pins, which may be connected to the sensor package in the first cavity 204 and extend through a wall into the second cavity 206.

The locating (or anti-rotation) tab 210 may be disposed along a side of the sensor cavity 206 and the socket cavity 208. The mounting boss 208 and the locating tab 210 are generally configured to facilitate locating the sensor module 200 to a vehicle structure (e.g., A-pillar, B-pillar, door panel, body panel, etc.). The locating tab 210 may include resilient tabs (barbs) providing a snap fit into a corresponding receiving hole of the vehicle structure to which the sensor module 200 is mounted. In various embodiments, a center axis of the mounting bore 212 may be aligned parallel to the locating tab 210. In an example, the mounting boss 208 may be askew of (or offset from) a centerline of the portion of the housing assembly 202 containing the first cavity 204 and the second cavity 206. Other arrangements of the mounting boss 208 and the location feature 210 may be implemented to meet the design criteria of a particular application.

Figure 14:
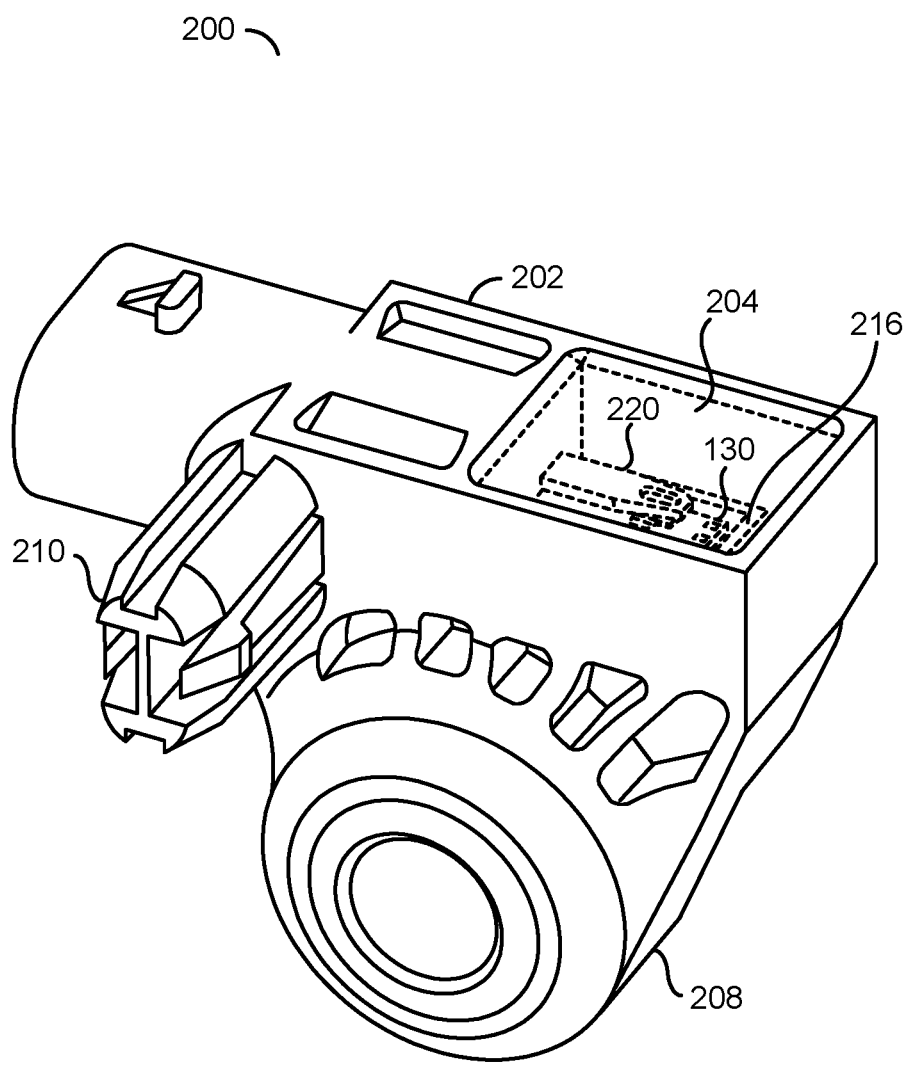
FIG. 14 is a diagram illustrating an interior view of a sensor cavity of the sensor housing of FIG. 13.

Referring to FIG. 14, a diagram is shown illustrating a sensor cavity of the sensor housing 202 of FIG. 13. In various embodiments, the first (sensor) cavity 204 may include a recessed pocket 216 into which the sensor package 130 may be placed. The recessed pocket 216 is generally configured to constrain the sensor package 130. In an example, the recessed pocket 216 may be defined by walls rising from a recessed surface of the first cavity 204. However, other features may be implemented to define the pocket 216. In an example, the pocket 216 may be defined similarly to a recessed pocket described in co-pending U.S. patent application Ser. No. 15/918,102, which is hereby incorporated by reference in its entirety.

During an example manufacturing process, when the sensor package 130 is placed in the pocket 216, terminals (pins) 220 for making electrical connections with the sensor package 130 may be installed (e.g., stitched) into the wall between the cavity 204 and the cavity 206, such that the ends of the terminals are adjacent to contact pads 132 in the surface of the sensor package 130. In an example, ports in a wall between the cavity 204 and the cavity 206 may be configured to allow the terminals 220 to be stitched through the wall either from the cavity 204 or the cavity 206. The ports may be configured to ensure the terminals 220 are aligned with the sensor package 130 installed in the pocket 216 of the sensor cavity 204. In various embodiments, the ports may be formed slightly smaller than the terminals 220 such that a tight mechanical fit is formed to hold the terminals 220 in place in the housing assembly 202. In some embodiments, the terminals 220 may include barbs that lock the terminals 220 into the wall between the cavities 204 and 206.

Referring to FIG. 15, a diagram is shown illustrating placement of the sensor package 130 into the pocket 216 provided within the sensor cavity 204 of the sensor housing assembly 200 of FIG. 13. The sensor package 130 is generally placed within the pocket 216 with the surface containing the electrical contact pads 132 visible through the sensor receiving opening of the first (sensor) cavity 204.

Referring to FIG. 16, a diagram is shown illustrating insertion of the stitched terminals 220 via the connector cavity 206 of the sensor housing assembly 200 of FIG. 13 following placement of the sensor package 130 into the pocket 216 of the sensor cavity 204. The pins 220 are generally stitched (inserted) through the wall between the first cavity 204 and the second cavity 206 until apertures 226 in a first (sensor contact) end of the pins 220 are essentially centered over the electrical contact pads 132 of the sensor package 130. In an example, the terminal pins 220 may have a shouldered barbed portion 228 that limits a depth to which the pins 220 are inserted and locks the pins 220 into the wall material.

Figure 17:
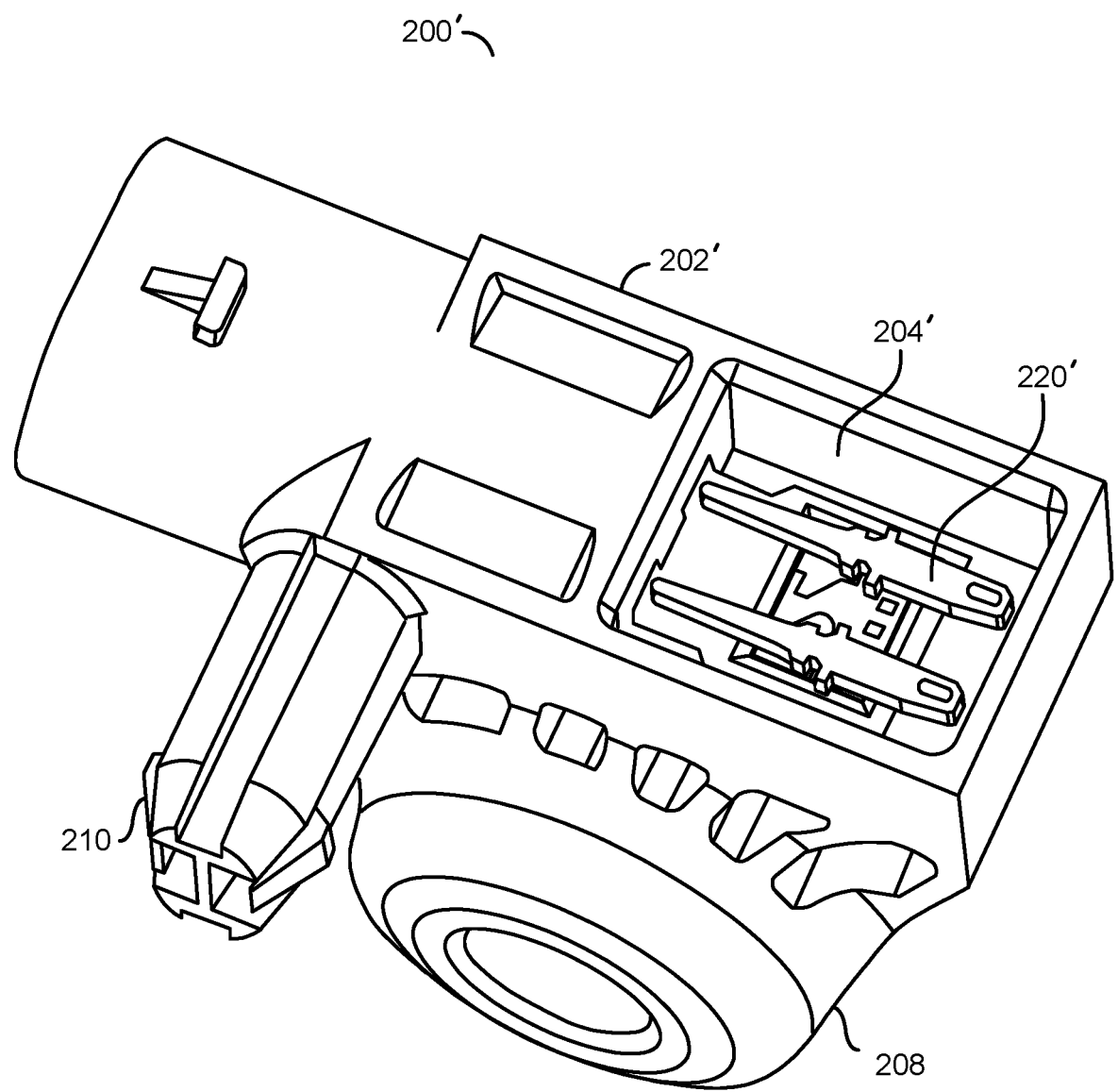
FIG. 17 is a diagram illustrating an embodiment where stitched terminals are inserted via the sensor cavity of the sensor housing of FIG. 13 after the sensor package has been placed in the pocket of the sensor housing of FIG. 13.

Referring to FIG. 17, a diagram is shown illustrating a sensor module 200' in accordance with another example embodiment of the invention. The sensor module (or apparatus or device or unit) 200' generally implements a kinematic sensor suitable for use in automotive applications. In an example, the sensor module 200' may be used to implement a remote sensor unit (RSU). In an example, the RSU may be part of a passive restraint control system of a vehicle. The sensor module 200' generally comprises a housing assembly 202'. In an example, the housing assembly 202' may comprise a first cavity 204', a second cavity 206, a mounting boss 208, and a locating (or anti-rotation) tab 210. The sensor module 200' is generally similar to the sensor module 200 except that the first cavity 204' of the housing assembly 202' is elongated compared to the first cavity 204 of the sensor module 200. The elongated first cavity 204' allows stitched terminals 220' to be stitched from within the first cavity 204' following placement of the sensor package 130 into the pocket 216 of the sensor cavity 204'. The terminal pins 220' are generally stitched (inserted) through a wall between the first cavity 204' and the second cavity 206 until apertures 226 in the ends of the pins 220' are essentially centered over the electrical contact pads 132 of the sensor package 130.

The housing assembly 202' may be formed of a plastic material. In various embodiments, the plastic material may include, but is not limited to polyamide (NYLON), polybutylene terephthalate (PBT), polypropylene, polyethylene terephthalate (PET), acrylonitrile butadiene styrene (ABS), and/or various alloys and/or fillers of these resins. The housing assembly 202' may be formed using various techniques including, but not limited to casting, injection-molding, and three-dimensional printing. The housing assembly 202' may have a generally elongated shape. The first cavity 204' may be configured to receive a sensor package and stitched terminals. The second cavity 206 may be configured to receive an electrical connector (e.g., for connecting the sensor module to the vehicle systems). The mounting boss 208 generally includes a mounting bore. The mounting bore is generally configured to receive a bolt for mounting the sensor module to a structure (e.g., frame, pillar, or panel of a vehicle, etc.). In some embodiments, a bushing may be disposed within the mounting bore to isolate the sensor module from the mounting structure. The bushing may be a metal bushing.

The first cavity 204' is generally disposed at a first (e.g., back) end of the housing assembly 102'. The first cavity 204' may be accessible through an opening (e.g., a sensor receiving opening) in a first (e.g., top) surface of the housing assembly 202'. The first (sensor) cavity 204' and sensor receiving opening providing access to the inside of the first cavity 204' are generally shaped to receive and allow manipulation of stitched terminal pins and a sensor package. The second cavity 206 may be formed at a second (front) end of the housing assembly 202', opposite from the first end. The second cavity 206 is generally accessible through an opening in the second end of the housing assembly 202'. The first cavity 204' and the second cavity 106 are generally separated by a wall.

A number of ports may be formed in the wall separating the cavities 204' and 206. The ports are generally configured to facilitate insertion of stitched-in terminals 220' from within the first cavity 204'. The second cavity 206 is generally shaped to receive an electrical socket (or plug) configured to make electrical connection(s) between a second end of the terminals (or pins) 220' and a wiring harness of a vehicle. The terminal pins 220' generally have a first (sensor contact) end that extends from the wall into the first cavity 204' and a second (connector) end the extends from the wall into the second cavity 206. The first ends may be configured to facilitate connection (e.g., via solder deposition and reflow) to the sensor package in the first cavity 204'.

Figure 18:
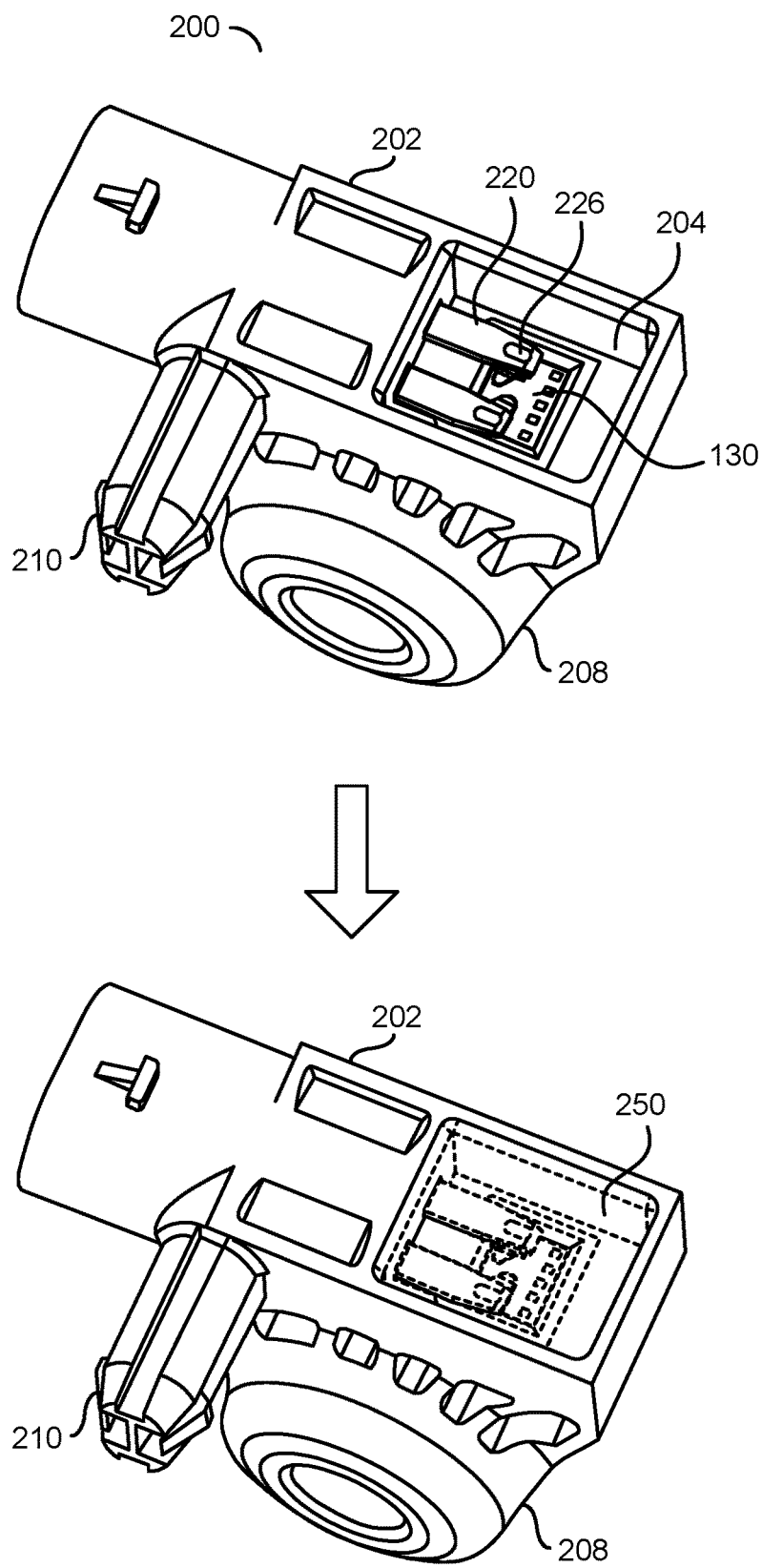
FIG. 18 is a diagram illustrating (a) electrical and mechanical connections formed between contact pads of the sensor package and the stitched terminals, and (b) an environmental seal formed in the sensor cavity of the sensor housing.

Referring to FIG. 18, a diagram is shown illustrating (a) electrical and mechanical connections formed between contact pads of the sensor package and the stitch in terminals and (b) an environmental seal formed in the sensor cavity of the sensor housing of either FIG. 13 or FIG. 17. In an example, preform solder balls may be placed in the apertures 226 of the pins 220 (or 220') and a reflow operation performed to form solder junctions providing electrical and mechanical connections between the terminals 220 (or 220') and the sensor package 130. The solder junctions may be inspected for robustness via the sensor receiving opening in the first cavity 204 (or 204'). Once the inspection is completed, the sensor cavity 204 (or 204') may be sealed by application of a potting material 250.

Figure 19:
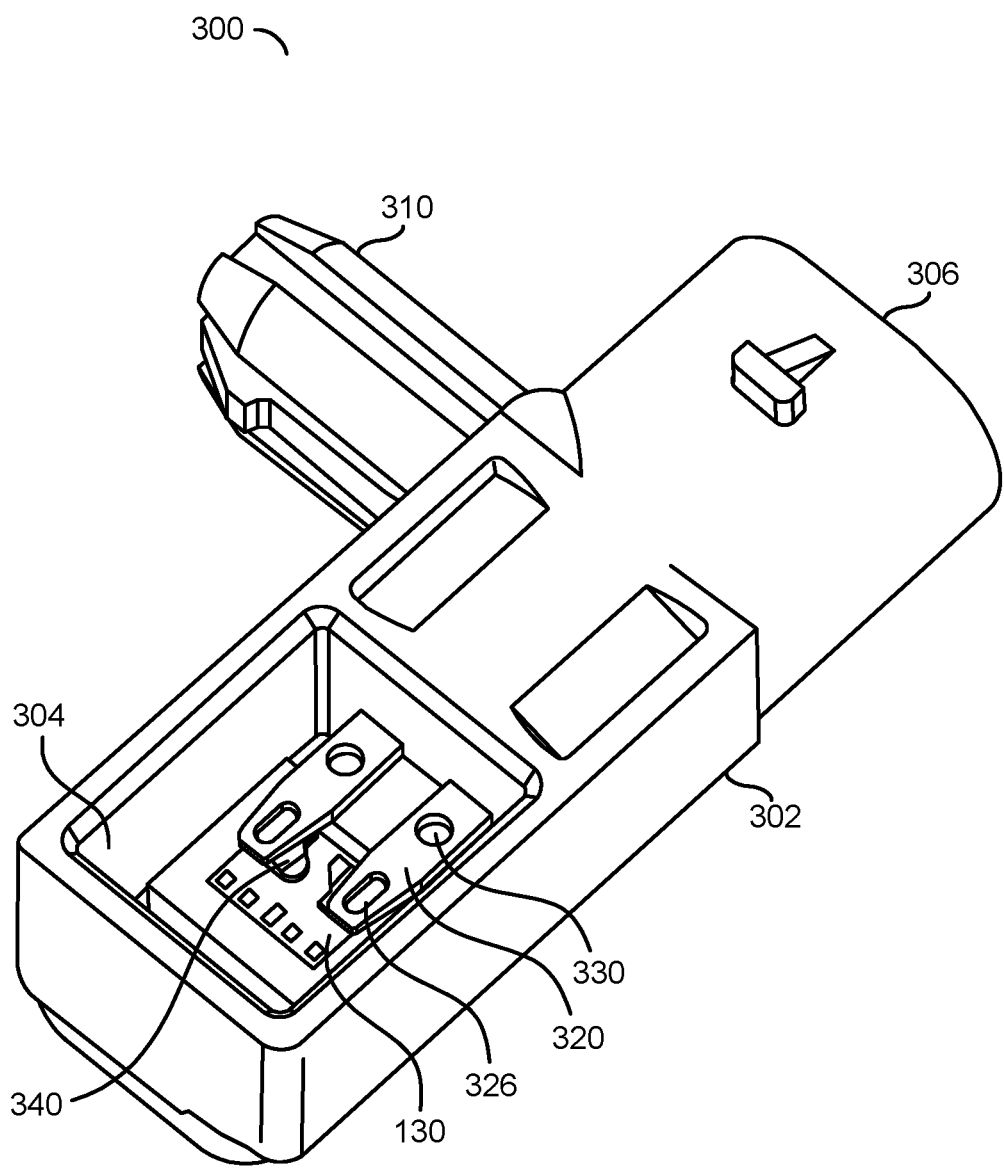
FIG. 19 is a diagram illustrating a design overview of a sensor housing facilitating a place-and-stitch method in accordance with another example embodiment of the invention.

Referring to FIG. 19, a diagram is shown illustrating a sensor housing 300 facilitating a place-and-stitch method in accordance with another example embodiment of the invention. In some embodiments, terminal pins 320 may be implemented similarly to the pins 220 (or 220') to make electrical connection(s) between the sensor package 130 and a wiring harness of a vehicle. The pins 320 generally have a first (sensor contact) end that extends from a wall of a sensor housing 302 into a first cavity 304 and a second (connector) end extending from the wall into a second cavity 306. The first ends of the pins 320 may be configured to (a) facilitate connection to the sensor package 130 in the first cavity 304 (e.g., via a first aperture 326) and (b) facilitate anchoring the terminal pins 320 to the sensor housing 302 (e.g., via a second aperture 330). The first aperture (or opening or hole) 326 may be aligned with an electrical contact pad in the sensor package 130. The second aperture (or opening or hole) 330 may be aligned with a recessed hole in sensor housing 302. When potting material fills the cavity 304, the potting material may flow through the aperture 330 into the recessed hole in the sensor housing 302, and, once cured, act as a pin anchoring the terminal 320 to the sensor housing 300. Preform solder may be placed in the first aperture 326 and a reflow operation performed to produce electrical and mechanical connections 340 between the pins 320 and the electrical contact pads of the sensor package 130.

Figure 20:
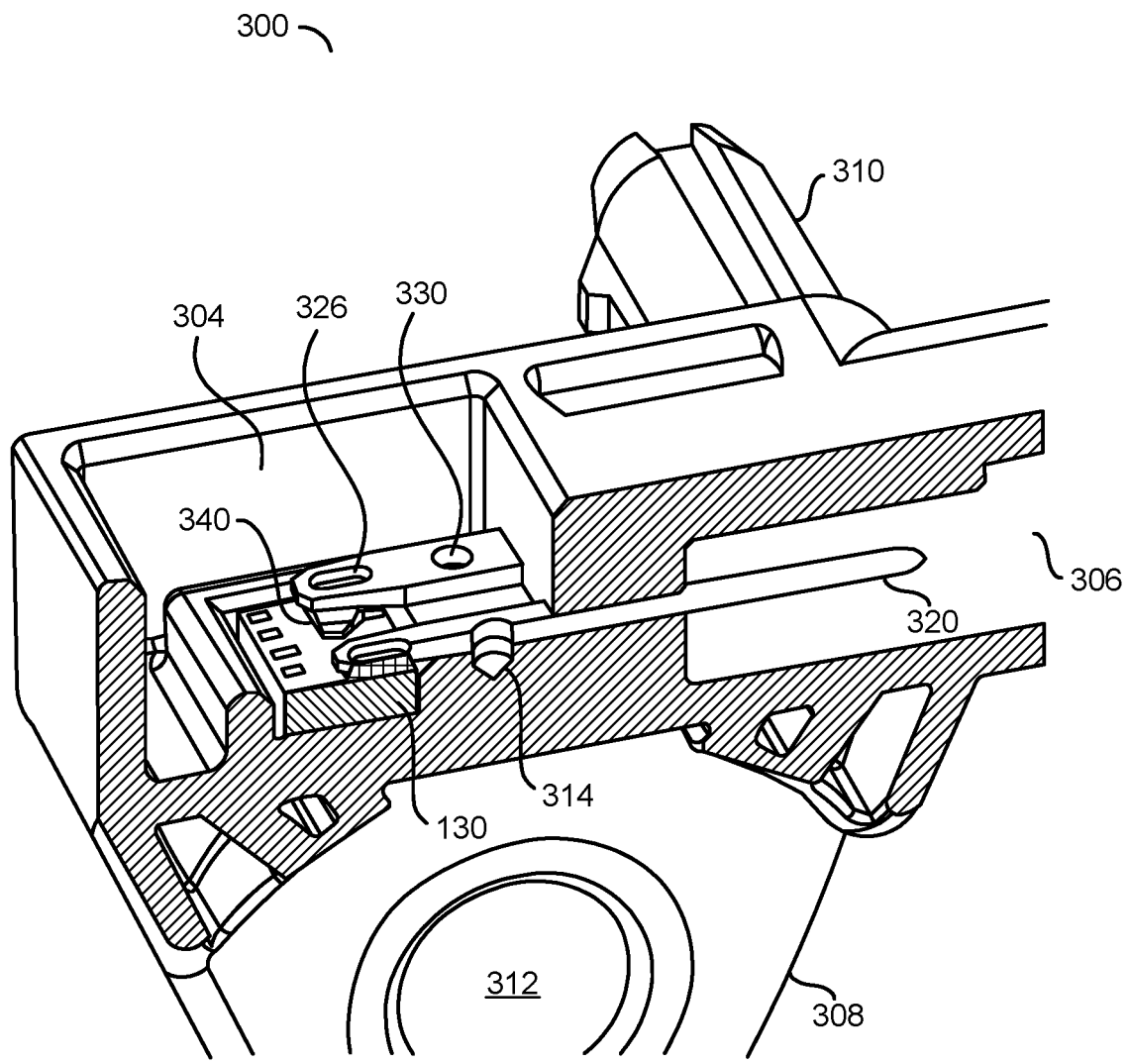
FIG. 20 is a diagram illustrating formation of a rigid connection to a sensor package in a place-and-stitch sensor assembly in accordance with an example embodiment of the invention.

Referring to FIG. 20, a diagram is shown illustrating a cross-sectional view of solder connections and anchoring holes in a place-and-stitch sensor assembly in accordance with an example embodiment of the invention. The second aperture 330 of the pins 320 are generally configured to align with corresponding recessed holes 314 in the sensor housing 320. The second (connector) end of the pins 320 is shown extending into the second (connector) cavity 306.

Figure 21:
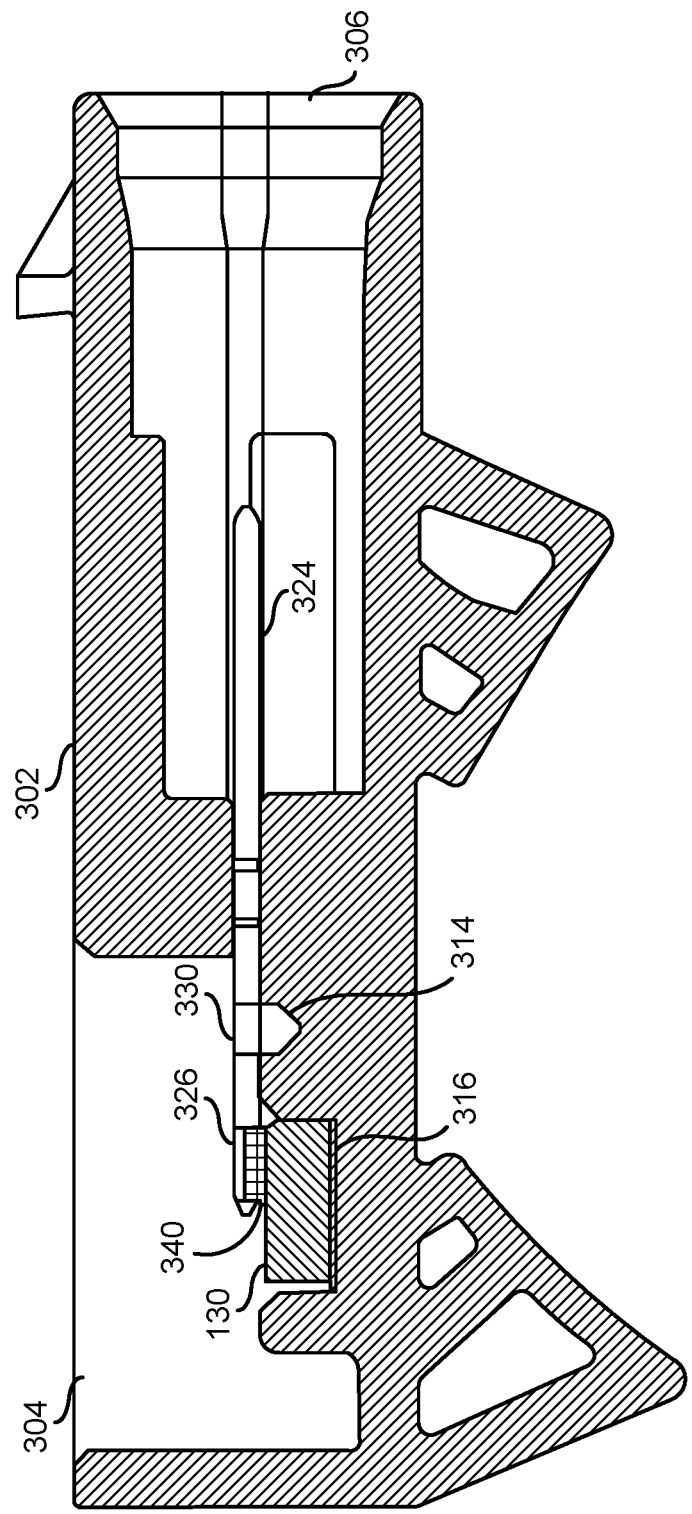
FIG. 21 is a diagram illustrating a cross-section of a place-and-stitch sensor assembly in accordance with an example embodiment of the invention.

Referring to FIG. 21, a diagram is shown illustrating another cross-sectional view of the place-and-stitch sensor assembly in accordance with an example embodiment of the invention. FIG. 21 generally illustrates vertical dimensions showing an example depth of the anchoring hole 314 relative to the sensor body and a recessed surface of a pocket 316.

Figure 22:
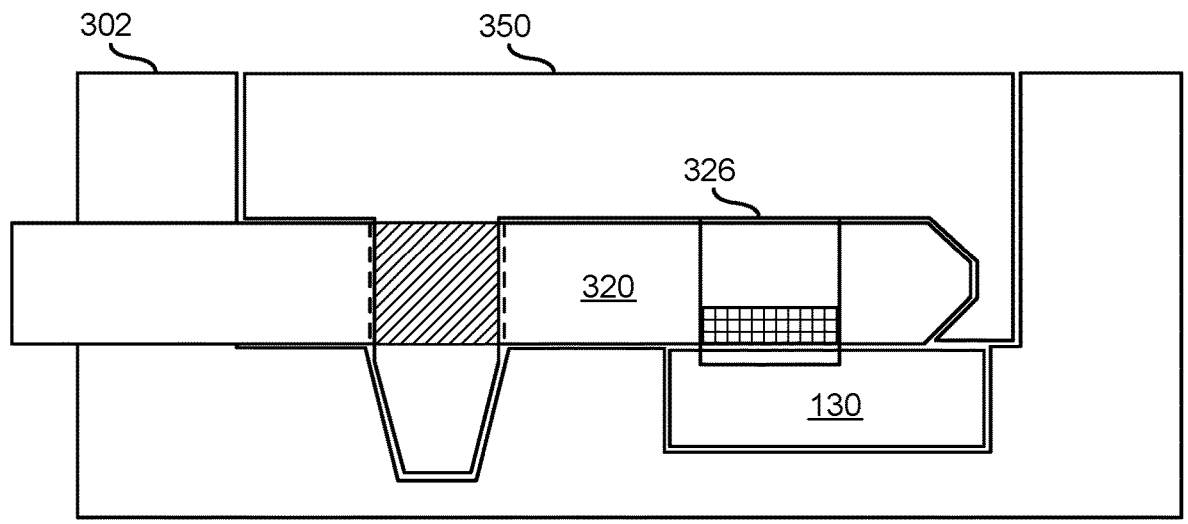
FIG. 22 is a diagram illustrating a method of anchoring stitched terminals inserted in the sensor housing of FIG. 20.

Referring to FIG. 22, a diagram is shown illustrating a method of anchoring the stitch-in terminals inserted in a sensor cavity of a sensor housing in accordance with an example embodiment of the invention. The sections where the potting material fills in are generally shown.

Figure 23:
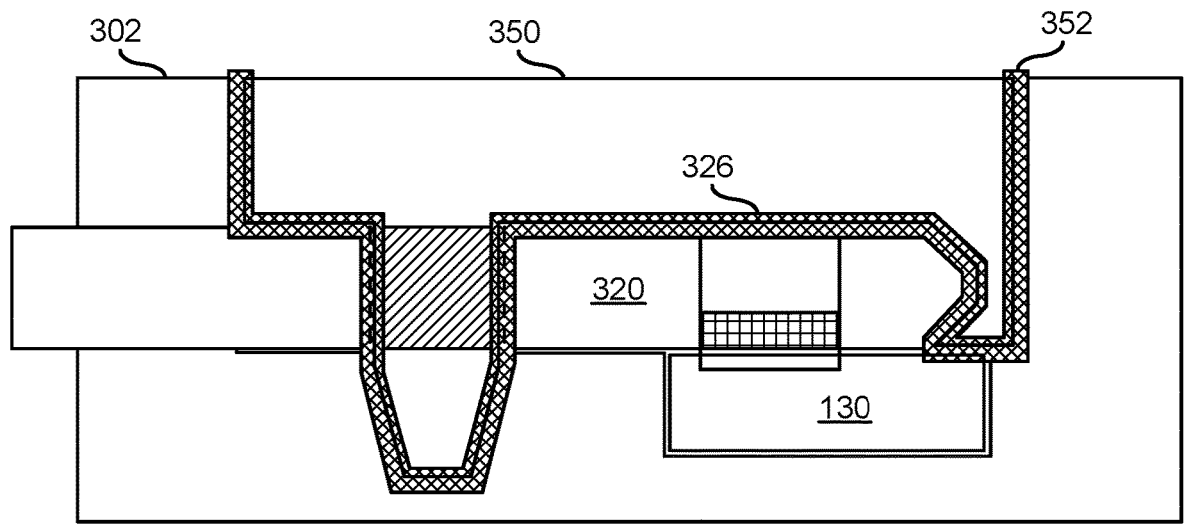
FIG. 23 is a diagram illustrating bond formation of a potting material used to anchor the stitched terminals and environmentally seal the sensor cavity of the sensor housing of FIG. 20.

Referring to FIG. 23, a diagram is shown illustrating bond formation of a potting material used to anchor stitch-in terminals inserted in the sensor cavity of the sensor housing of FIG. 19. An adhesion surface is generally created with the potting material 350. Notably, a continuous line 352 is formed that connects all of the components and attaches them rigidly to the housing material.

In various embodiments, the present invention generally provides a remote sensor unit (RSU) comprising a sensor and sensor housing and a method of assembling the remote sensor unit. In various embodiments, the invention may provide a number of features including but not limited to a groove by which the sensor component may be translated inside the sensor housing; an open region within the RSU housing which allows the sensor to be placed below the pins of the connector; a cavity made on the sides and bottom by the housing and on top by the pins into which the sensor may be slid; the cavity generally allows for the sensor to be seated without compression on the sensor body. A number of additional features may include, but are not limited to a hole placed in the end of the pins to allow for solder to be deposited within, ribs in the aforementioned groove that center the sensor body into a final position, and a hole placed in the pins to allow anchoring the pins to the housing.

In general, the groove(s) may keep the sensor package straight and oriented correctly in the sensor housing. The groove(s) may allow for the sensor body to be guided into the final position within the sensor cavity. The sensor housing is generally configured to provide an open region to allow the sensor package to be placed below the stitched pins. The sensor cavity is generally configured to constrain the sensor body over a lifetime of the RSU and orients the sensor package relative to the connector pins. In general, no compression is transmitted to the sensor body. Pin holes may be provided allowing for solder to be deposited and inspected. Guide ribs may be configured to center and constrain the sensor package over the lifetime of the RSU. The design generally allows for environmental resistance by means of potting or a secondary cover. In general, the invention provides advantages including, but not limited to, allowing for a fully PCB-less remote sensor unit (RSU) design, no compression on the sensor package, allowing for solder to be placed (e.g., solder preform), allowing for solder to be reflowed effectively (e.g., localized reflow of placed solder), allowing for final inspection of the solder joint to verify robustness of connection, allowing for stitched terminals, providing rigid constraint of the sensor body relative to the housing over the lifetime of the RSU, and allowing a seal to be formed with either potting or a secondary cover.

The structures illustrated in the diagrams of FIGS. 1 to 23 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

Data signals generated by the sensor units may be transferred to one or more electronic control units. The electronic control units may utilize the sensor data in one or more transport vehicle functions including, but not limited to, engine control, transmission control, braking control, battery management, steering control, door control, human machine interface, seat control, speed control, restraint systems control, vehicle-to-vehicle communications and diagnostics. The electronic control units may include capabilities to adjust the sensor data to account for calibration issues, environmental factors and aging components.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
    a sensor package implementing a kinematic sensor and having a first surface comprising one or more electrical contact pads;
    a housing comprising a first cavity configured to receive said sensor package and a second cavity configured to receive an electrical connector, wherein the first cavity and the second cavity are separated by a wall, the first cavity is accessible through an opening in the housing, a support surface is located within the first cavity opposite the opening and extending from the wall separating the first cavity and the second cavity, the opening in the housing has dimensions allowing the sensor package to be placed and manipulated within the first cavity; and
    one or more stitched terminals stitched into the wall separating the first cavity and the second cavity, each having a sensor contact end extending from the wall into the first cavity and a connector contact end extending from the wall into the second cavity,
    wherein (i) at least one of the sensor package and the stitched terminals is positionable to align the electrical contact pads with the sensor contact ends of the stitched terminals, (ii) a distance between the support surface and the sensor contact ends of the stitched terminals allows the sensor package to be placed at a first position on the support surface within said first cavity and slid along the support surface from the first position to a second position on the support surface adjacent to the sensor contact ends of the stitched terminals until the electrical contact pads align with the sensor contact ends of the stitched terminals, (iii) the housing comprises ribs within the first cavity configured to center the sensor package on the support surface at a first position separated from the sensor contact ends of the stitched terminals when the sensor package is inserted, and (iv) the sensor package, when positioned between the support surface and the sensor contact ends of the stitched terminals, is essentially uncompressed.

2. The apparatus according to claim 1, wherein said sensor package is located on said support surface within said first cavity and said stitched terminals are stitched over said sensor package aligning the sensor contact ends of the stitched terminals with the electrical contact pads.

3. The apparatus according to claim 1, wherein:
    the sensor contact ends of the stitched terminals comprise apertures into which solder can be disposed; and the sensor contact ends of the stitched terminals are electrically and mechanically coupled to the electrical contact pads of the sensor package when soldered.

4. The apparatus according to claim 3, wherein:
the support surface faces the opening in the housing providing access to the first cavity; and
the sensor contact ends of the stitched terminals extend parallel to the support surface, with the apertures facing the opening in the housing providing access to the first cavity to provide access for soldering the sensor contact ends of the stitched terminals to the electrical contact pads of the sensor package using a soldering tool via the opening in the housing.

5. The apparatus according to claim 1, wherein the housing further comprises ledges within said first cavity, said ledges configured to center the sensor package on the support surface when the sensor package is slid along the support surface to a second position on the support surface adjacent to the sensor contact ends of the stitched terminals.

6. The apparatus according to claim 5, wherein the support surface further comprises a recessed groove providing access to a second surface of the sensor package on an opposite side of the sensor package from the first surface.

7. The apparatus according to claim 6, wherein the recessed groove is configured to allow a pick and place tool to place the sensor package on the support surface at the first position and guide the sensor package along the support surface to the second position adjacent to (i) the wall separating the first cavity and the second cavity and (ii) the sensor contact ends of the stitched terminals.

8. The apparatus according to claim 5, wherein the ledges, the support surface, and the sensor contact ends of the stitched terminals constrain the sensor package and orient the sensor package relative to the wall separating the first cavity and the second cavity without compressing the sensor package.

9. The apparatus according to claim 1, wherein each of the sensor contact ends of the stitched terminals comprises an aperture configured to anchor the stitched terminals to the housing when the first cavity is filled with a potting material.

10. The apparatus according to claim 1, wherein said first surface of said sensor package, said support surface of said housing, and said stitched terminals are parallel to each other.

11. The apparatus according to claim 1, wherein said first surface comprising said one or more electrical contact pads is (i) parallel to said support surface of said housing and (ii) perpendicular to said wall from which said one or more stitched terminals extend.

12. The apparatus according to claim 1, wherein said stitched terminals are separated from said support surface by a distance greater than a thickness of said sensor package, allowing said sensor package to be slid along said support surface and positioned between said stitched terminals and said support surface without contacting said stitched terminals.

13. An apparatus comprising:
a sensor package having a first surface comprising one or more electrical contact pads;
a housing comprising a first cavity configured to receive said sensor package and a second cavity configured to receive an electrical connector, wherein the first cavity and the second cavity are separated by a wall, the first cavity is accessible through an opening in the housing, a pocket having a recessed surface is located within an inner surface of the first cavity opposite the opening, the recessed surface of the pocket has dimensions corresponding to entire dimensions of the first surface of the sensor package, and the opening in the housing has dimensions allowing the sensor package to pass through the opening in the housing and be placed into the pocket; and
one or more stitched terminals stitched into the wall separating the first cavity and the second cavity, each having a sensor contact end extending from the wall separating the first cavity and the second cavity into the first cavity and a connector contact end extending from the wall separating the first cavity and the second cavity into the second cavity,
wherein (i) a distance between the recessed surface of the pocket and the sensor contact ends of the stitched terminals allows the stitched terminals to be stitched over the sensor package while the sensor package is in the pocket, (ii) the sensor contact ends of the stitched terminals are aligned with the electrical contact pads of the sensor package, and (iii) the sensor package, when positioned in the pocket between the recessed surface and the sensor contact ends of the stitched terminals, is essentially uncompressed.

14. The apparatus according to claim 13, wherein:
each of the sensor contact ends of the stitched terminals comprise a first aperture into which solder can be disposed; and
the sensor contact ends of the stitched terminals are electrically and mechanically coupled to the electrical contact pads of the sensor package when soldered.

15. The apparatus according to claim 14, wherein each of the sensor contact ends of the stitched terminals further comprise a second aperture configured to anchor the stitched terminals to the housing when the first cavity is filled with a potting material.

16. The apparatus according to claim 13, wherein the pocket and the sensor contact ends of the stitched terminals constrain the sensor package and orient the sensor package relative to the wall separating the first cavity and the second cavity without compressing the sensor package.

17. A method of manufacturing a remote sensor module comprising:
placing a sensor package implementing a kinematic sensor onto a support surface in a first cavity of a sensor housing, wherein said sensor package has a first surface comprising one or more electrical contact pads, said sensor housing comprises a second cavity configured to receive an electrical connector, the first cavity and the second cavity are separated by a wall, the first cavity is configured to receive the sensor package through an opening in the sensor housing opposite the support surface, the first cavity comprises either (i) ribs configured to center the sensor package on the support surface when the sensor package is placed at a first position on said support surface within said first cavity and slid to a second position on said support surface adjacent to the wall separating the first cavity from the second cavity of the sensor housing and one or more terminal pins, or (ii) a pocket located within an inner surface of the first cavity opposite the opening with the support surface recessed from the inner surface of the first cavity and having dimensions corresponding to entire dimensions of the first surface of the sensor package;
stitching the one or more terminal pins through the wall separating the first cavity of the sensor housing from the second cavity of the sensor housing, such that a sensor contact end of the one or more terminal pins is adjacent to the one or more electrical contact pads of the sensor package when the sensor package is between the support surface and the one or more terminal pins; and forming electrical and mechanical connections between the one or more electrical contact pads of the sensor package and the one or more terminal pins, wherein the sensor package is essentially uncompressed.

18. The method according to claim 17, wherein said sensor package is placed in said pocket within said inner surface of said first cavity and said one or more terminal pins are then stitched over said sensor package.

19. The method according to claim 17, wherein said electrical and mechanical connections are formed using a solder reflow process.

20. The method according to claim 17, further comprising anchoring said one or more terminal pins to the sensor housing via apertures in said one or more terminal pins by filling said first cavity with a potting material.

* * * * *